United States Patent
Wood et al.

(10) Patent No.: US 12,078,481 B2
(45) Date of Patent: Sep. 3, 2024

(54) INDUCTIVE SENSOR HAVING ONE OR MORE MODULAR CIRCUIT BOARDS

(71) Applicant: Kyocera AVX Components (Werne) GmbH, Werne (DE)

(72) Inventors: Robert Wood, Cambridge (GB); Peter Constantinou, Cambridge (GB); David Witts, Cambridge (GB)

(73) Assignee: Kyocera AVX Components (Werne) GmbH, Werne (DE)

( * ) Notice: Subject to any disclaimer, the term of this patent is extended or adjusted under 35 U.S.C. 154(b) by 742 days.

(21) Appl. No.: 17/106,729

(22) Filed: Nov. 30, 2020

(65) Prior Publication Data

US 2021/0348910 A1 Nov. 11, 2021

Related U.S. Application Data

(60) Provisional application No. 63/021,720, filed on May 8, 2020, provisional application No. 63/037,052, filed on Jun. 10, 2020.

(51) Int. Cl.
*G01D 5/20* (2006.01)
*G01B 7/30* (2006.01)
*H05K 7/14* (2006.01)

(52) U.S. Cl.
CPC ............... *G01B 7/30* (2013.01); *G01D 5/20* (2013.01); *H05K 7/1417* (2013.01)

(58) Field of Classification Search
CPC ........ G01D 5/20; G01D 5/204; G01D 5/2046; G01D 5/2053; G01D 5/206; G01D 5/2066;

(Continued)

(56) References Cited

U.S. PATENT DOCUMENTS

| 11,680,826 B2* | 6/2023 | Buchinger | ........... G01D 5/2053 |
| | | | 324/207.17 |
| 2008/0284554 A1* | 11/2008 | Schroeder | ............... H01F 21/10 |
| | | | 336/200 |

(Continued)

FOREIGN PATENT DOCUMENTS

| DE | 19850748 A1 * | 5/2000 | ............. G01V 3/107 |
| KR | 101252488 B1 * | 4/2013 | |

*Primary Examiner* — David M Schindler
(74) *Attorney, Agent, or Firm* — Dority & Manning, P.A.

(57) ABSTRACT

An inductive sensor includes a first circuit board having a sensor element configurable in a plurality of different coil configurations. The sensor element includes a transmit coil and a plurality of receive coils. The first circuit board includes interconnect points positioned at a same location on the first circuit board for each of the plurality of different coil configurations. The inductive sensor includes a second circuit board spaced apart from the first circuit board along the axial direction. The second circuit board includes processing circuitry associated with the sensor element and configurable in a plurality of different configurations. The second circuit board includes interconnect points positioned at a same location on the second circuit board for each of the configurations of the processing circuitry. Furthermore, each interconnect point on the second circuit board is aligned with a corresponding interconnect point on the first circuit board along circumferential and radial directions.

7 Claims, 22 Drawing Sheets

(58) Field of Classification Search
CPC ........ G01D 5/2073; G01D 5/22; G01D 5/225; G01D 5/2258; G01D 5/2266; G01D 5/2275; G01D 5/2283; G01D 5/2291; G01D 5/145; G01B 7/30
See application file for complete search history.

(56) References Cited

U.S. PATENT DOCUMENTS

| | | | |
|---|---|---|---|
| 2010/0244816 A1* | 9/2010 | Nakamura | H02K 3/26 324/207.25 |
| 2020/0072643 A1* | 3/2020 | Qama | G01D 5/2053 |

* cited by examiner

INDUCTIVE SENSOR HAVING ONE OR MORE MODULAR CIRCUIT BOARDS

PRIORITY CLAIM

The present application claims the benefit of priority of U.S. Provisional Application Ser. No. 63/021,720, titled "Inductive Sensor Having One or More Modular Circuit Boards," filed on May 8, 2020, which is incorporated herein by reference. The present application also claim the benefit of priority of U.S. Provisional Application Ser. No. 63/037,052, titled "Inductive Sensor Having One or More Modular Circuit Boards," filed on Jun. 10, 2020, which is also incorporated herein by reference.

FIELD

The present disclosure relates generally to inductive sensors and, more particularly, to inductive sensors having one or more modular circuit boards.

BACKGROUND

Inductive sensors can include a target and a sensor element. The target can be mounted to a first object. The sensor element can be mounted to a second object that is stationary relative to the first object. The sensor element can include a transmit coil and a plurality of receive coils. The plurality of receive coils can be inductively coupled to the transmit coil each time the target passes over the sensor element. When the plurality of receive coils are inductively coupled to the transmit coil, each of the plurality of receive coils can output a signal that can be used to determine a position of the first object relative to the second object. Additionally, the signal can be used to determine a speed of the first object.

SUMMARY

Aspects and advantages of embodiments of the present disclosure will be set forth in part in the following description, or may be learned from the description, or may be learned through practice of the embodiments.

In one aspect, an inductive sensor is provided. The inductive sensor defines an axial direction, a circumferential direction, and a radial direction. The inductive sensor includes a first circuit board. The first circuit board includes a sensor element configurable in a plurality of different coil configurations. The sensor element includes a transmit coil and a plurality of receive coils. The transmit coil is configured to induce an electrical current in the plurality of receive coils via a target. The first circuit board further includes a plurality of interconnect points positioned at a same location on the first circuit board for each of the plurality of different coil configurations. The inductive sensor includes a second circuit board that is spaced apart from the first circuit board along the axial direction. The second circuit board includes processing circuitry associated with the sensor element. The processing circuitry is configurable in a plurality of different configurations. The second circuit board further includes a plurality of interconnect points positioned at a same location on the second circuit board for each of the plurality of different configurations of the processing circuitry. Furthermore, each of the plurality of interconnect points on the second circuit board is aligned with a corresponding interconnect point of the plurality of interconnect points on the first circuit board along the circumferential direction and the radial direction.

In another aspect, an inductive sensor is provided. The inductive sensor defines an axial direction, a circumferential direction, and a radial direction. The inductive sensor includes a housing defining a cavity. The inductive sensor further includes a target. The inductive sensor even further includes a first circuit board. The first circuit board includes a sensor element configurable in a plurality of different coil configurations. The sensor element includes a transmit coil and a plurality of receive coils. The transmit coil is configured to induce an electrical current in the plurality of receive coils via a target. The first circuit board further includes a plurality of interconnect points positioned at a same location on the first circuit board for each of the plurality of different coil configurations. The inductive sensor includes a second circuit board that is spaced apart from the first circuit board along the axial direction. The second circuit board includes processing circuitry associated with the sensor element. The processing circuitry is configurable in a plurality of different configurations. The second circuit board further includes a plurality of interconnect points positioned at a same location on the second circuit board for each of the plurality of different configurations of the processing circuitry. Furthermore, each of the plurality of interconnect points on the second circuit board is aligned with a corresponding interconnect point of the plurality of interconnect points on the first circuit board along the circumferential direction and the radial direction.

In yet another aspect, an inductive sensor is provided. The inductive sensor includes a target and a circuit board. The circuit board includes a sensor element included within a first set of layers of the circuit board. The sensor element is configurable in a plurality of different coil configurations. The sensor element includes a transmit coil and a plurality of receive coils. The transmit coil is configured to induce an electrical current in the plurality of receive coils via the target. The circuit board further includes processing circuitry associated with the sensor element. The processing circuitry is included within a second set of layers of the circuit board. The processing circuitry is configurable in a plurality of different configurations. The circuit board includes a third set of layers positioned between the first set of layers and the second set of layers. The circuit board further includes a plurality of conductive through-hole vias extending from the first set of layers to the second set of layers via the third set of layers. Each of the plurality of conductive through-hole vias is positioned at a same location on the circuit board for each of the plurality of different coil configurations of the sensor element and each of the plurality of different configurations of the processing circuitry.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
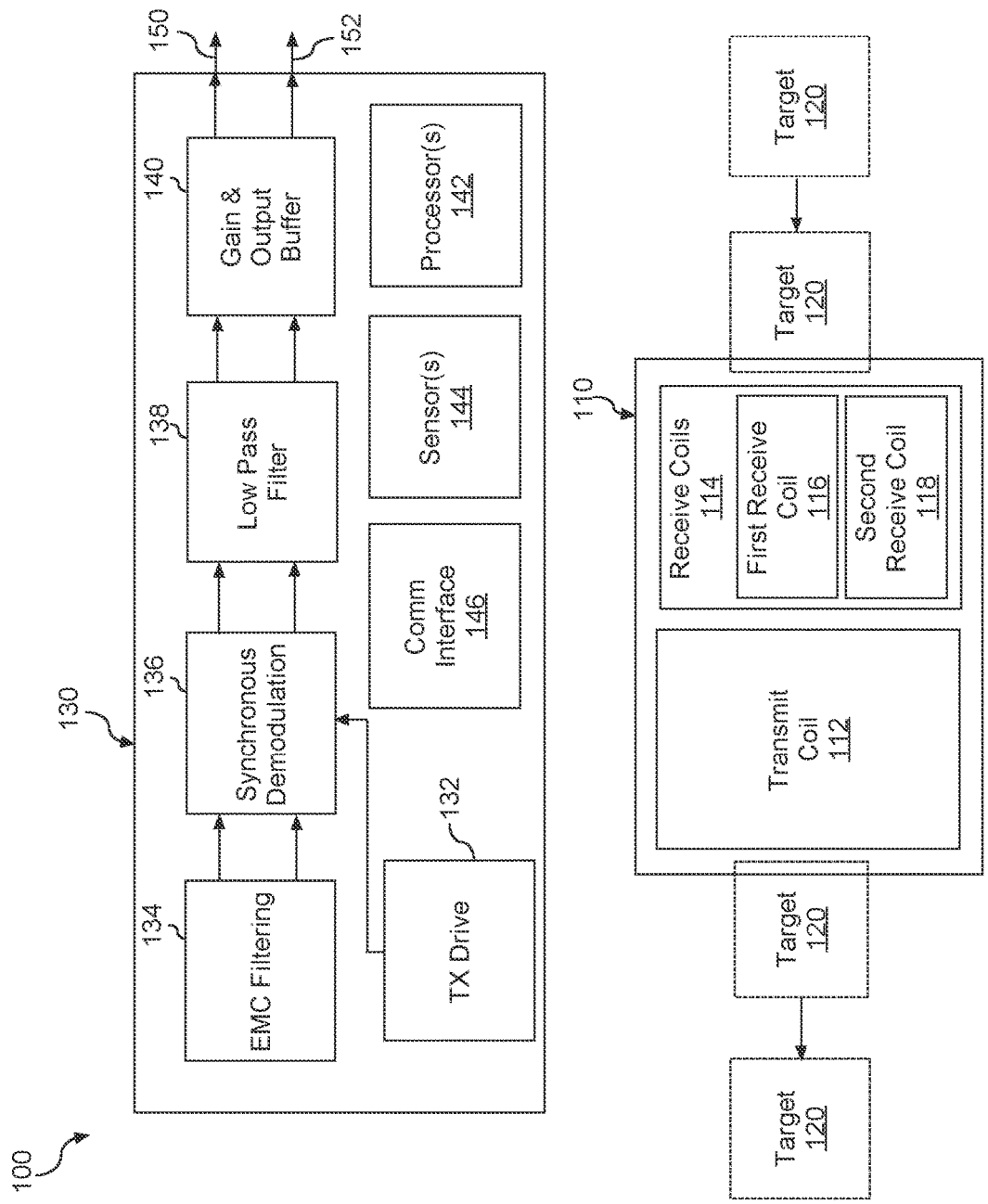
FIG. 1 depicts an inductive sensor according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to an inductive sensor for applications associated with controlling operation of an electric motor or generator. The inductive sensor can include a first circuit board on which a sensor element is disposed. The sensor element can include a transmit coil and a plurality of receive coils. The inductive sensor can further include a second circuit board on which processing circuitry (e.g., processors, memory devices, communication interface, etc.) associated with the sensor element is disposed. The second circuit board can be spaced apart from the first circuit board along an axial direction. Furthermore, the first circuit board and the second circuit board can each include a plurality of interconnect points to accommodate an interconnect assembly configured to electrically couple the first circuit board to the second circuit board to facilitate electrical communication between the sensor element and the processing circuitry.

The sensor element on the first circuit board can be configurable in a plurality of different coil configurations to accommodate different types (e.g., pole-pair configurations) of electric motors or generators. In some implementations, the plurality of receive coils can have a different number of coil periods for each of the plurality of different coil configurations. For instance, the plurality of receive coils can have a first number of coil periods when the sensor element is arranged according to a first coil configuration to accommodate a first electric motor. Conversely, the plurality of receive coils can have a second number of coil periods when the sensor element is arranged according to a second coil configuration to accommodate a second electric motor that is different than the first electric motor. For instance, in some implementations, a pole-pair configuration of the first electric motor can be different than a pole-pair configuration of the second electric motor. However, it should be understood that a location of the plurality of interconnect points on the first circuit board can be the same (e.g., fixed) for each of the plurality of coil configurations of the sensor element. In this manner, the first circuit board can be changed out to accommodate different electric motors or generators without having to change or modify the interconnect assembly.

In some implementations, the plurality of interconnect points on the first circuit board can be divided into a plurality of groups. Furthermore, each of the plurality of groups can be disposed at a different location on the first circuit board. For instance, in some implementations, the plurality of interconnect points can be divided into four separate groups. The first group of interconnect points can be disposed at a first location on the first circuit board. The second group can be disposed at a second location on the first circuit board that is circumferentially spaced from the first location by about 90 degrees. The third group can be disposed at a third location on the first circuit board that is circumferentially spaced from the first location by about 180 degrees. The fourth group can be disposed at a fourth location on the first circuit board that is circumferentially spaced from the first location by about 270 degrees. As used herein, the term "about" refers to a range of values within 10% of a stated numerical value.

It should be appreciated that the location of each of the plurality of groups of interconnect points on the first circuit board can allow the first circuit board to accommodate each of the plurality of coil configurations of the sensor element without having to change a location of the plurality of interconnect points thereon. In this manner, a first circuit board having a sensor element arranged according to a first coil configuration can be changed out for a first circuit board having a sensor element arranged according to a second coil configuration without having to change or modify the interconnect assembly.

The processing circuitry on the second circuit board can be configurable in a plurality of different configurations. For instance, the processing circuitry (e.g., sensors, processors, communication interface, etc.) can be arranged on the second circuit board according to a first configuration or layout. Alternatively, the processing circuitry can be arranged on the second circuit board according to a second configuration or layout that is different than the first configuration. However, it should be understood that a location of the plurality of interconnect points on the second circuit board can be the same (e.g., fixed) for each of the plurality of configurations of the processing circuitry. In this manner, a second circuit board having processing circuitry arranged thereon according to the first configuration can be changed out for a second circuit board having processing circuitry arranged thereon according to the second configuration without having to change or modify the interconnect assembly.

In some implementations, the plurality of interconnect points on the second circuit board can be divided into a plurality of groups. Furthermore, each of the plurality of groups can be disposed at a different location on the second circuit board. For instance, in some implementations, the plurality of interconnect points can be divided into four separate groups. The first group of interconnect points can be disposed at a first location on the second circuit board. The second group can be disposed at a second location on the second circuit board that is circumferentially spaced from the first location by about 90 degrees. The third group can be disposed at a third location on the second circuit board that is circumferentially spaced from the first location by about 180 degrees. The fourth group can be disposed at a fourth location on the second circuit board that is circumferentially spaced from the first location by about 270 degrees.

It should be appreciated that the location of each of the plurality of groups of interconnect points on the second circuit board can allow the second circuit board to accommodate each of the plurality of configurations of the processing circuitry without having to change a location of the plurality of interconnect points thereon. In this manner, a second circuit board having processing circuitry arranged thereon according to the first configuration can be changed out for a second circuit board having processing circuitry arranged thereon according to the second configuration without having to change or modify the interconnect assembly. It should also be appreciated that the plurality of interconnect points on the second circuit board can be aligned with the plurality of interconnect points on the first circuit board along a radial direction and a circumferential direction.

In some implementations, the inductive sensor can include a housing configured to accommodate the first circuit board, the second circuit board, and the interconnect assembly. For instance, the housing can define a cavity configured to accommodate the first circuit board, the second circuit board, and the interconnect assembly. The first circuit board, the second circuit board, and the interconnect assembly can be positioned within the cavity in a stacked configuration such that the interconnect assembly is positioned between the first circuit board and the second circuit board. It should be appreciated that the housing, the first circuit board, and the second circuit board can have any suitable shape. For instance, in some implementations, the housing, the first circuit board, and the second circuit board can each have an annular shape.

In some implementations, a target of the inductive sensor can include a backplate. In such implementations, the target can be positioned relative to the housing such that the housing and the backplate of the target collectively shield the circuit boards (e.g., first circuit board and second circuit board) of the inductive sensor from an external environment in which the inductive sensor is located. More specifically, the housing and the backplate of the target can isolate the circuit boards of the inductive sensor from one or more metal components present within the external environment. In this manner, electromagnetic coupling between one or more external metal components and the circuit boards of the inductive sensor can be prevented.

Furthermore, in some implementations, the target can be positioned relative to the housing such that an air gap is defined between the housing and the backplate of the target along the radial direction and the axial direction. In such implementations, a length of the backplate as measured along the radial direction can be at least as long as a length of the first circuit board along the radial direction and a length of the second circuit board along the radial direction. In this manner, the housing and the backplate of the target can still shield the circuit boards (e.g., first circuit board and second circuit board) of the inductive sensor from the external environment despite the air gap defined between housing and the backplate along the radial direction.

Details of the interconnect assembly configured to electrically couple the first circuit board to the second circuit board will now be discussed. In some implementations, the interconnect assembly can include a plurality of conductive pins coupled between the first circuit board and the second circuit board. For instance, in some implementations, a first end of each of the plurality of conductive pins can be connected to the first circuit board. Additionally, a second end of each of the plurality of conductive pins can be connected to the second circuit board. In this manner, the sensor element disposed on the first circuit board can be in electrical communication with the processing circuit disposed on the second circuit board via the plurality of conductive pins.

It should be appreciated that the plurality of conductive pins can be connected to the first circuit board and the second circuit board in any suitable manner. For instance, in some implementations, the first end of each of the plurality of conductive pins can be soldered to a corresponding interconnect point of the plurality of interconnect points (e.g., solder pads) on the first circuit board. Likewise, the second end of each of the plurality of conductive pins can be soldered to a corresponding interconnect point of the plurality of interconnect points on the second circuit board.

In some implementations, the interconnect assembly can include a spacer. The spacer can be positioned between the first circuit board and the second circuit board along the axial direction. It should be appreciated that the spacer can have any suitable shape. For instance, in some implementations, the spacer can have an annular shape.

The spacer can define a plurality of apertures. Each of the plurality of apertures can be aligned with a corresponding interconnect point of the plurality of interconnect points on the first circuit board and the second circuit board, respectively, along the radial direction and the circumferential direction. In this manner, each of the plurality of apertures can accommodate a corresponding conductive pin of the plurality of conductive pins coupled between the first circuit board and the second circuit board.

In some implementations, the plurality of apertures defined by the spacer can be divided into a plurality of groups. Furthermore, each of the plurality of groups can be disposed at a different location on the spacer. For instance, in some implementations, the plurality of apertures can be divided into four separate groups. The first group of apertures can be disposed at a first location on the spacer. The second group of apertures can be disposed at a second location on the spacer that is circumferentially spaced from the first location by about 90 degrees. The third group of apertures can be disposed at a third location on the spacer that is circumferentially spaced from the first location by about 180 degrees. The fourth group can be disposed at a fourth location on the spacer that is circumferentially spaced from the first location by about 270 degrees.

In some implementations, the spacer can include one or more posts extending axially through a corresponding aperture of a plurality of apertures defined by the first circuit board. In this manner, movement of the first circuit board along at least one direction (e.g., radial direction) can be limited via the spacer. Alternatively or additionally, the spacer can include one or more posts extending axially through a corresponding aperture of a plurality of apertures defined by the second circuit board. In this manner, movement of the second circuit board along one or more directions (e.g., radial direction) can be limited via the spacer. In some implementations, the plurality of interconnect points on the first circuit board can include the plurality of apertures defined by the first circuit board. Alternatively or additionally, the plurality of interconnect points on the second circuit board can include the plurality of apertures defined by the second circuit board.

The inductive sensor according to the present disclosure can provide numerous technical effects and benefits. For example, since the location of the plurality of interconnect points on the first circuit board are the same (e.g., fixed) for each of the plurality of different coil configurations of the sensor element disposed thereon, the first circuit board can be changed out without having to modify or change the interconnect assembly. This can facilitate interchangeability of the first circuit board to accommodate electric motors requiring different coil configurations. Furthermore, interconnect points on the first circuit board that are not used by the interconnect assembly can be used to aide in orienting the spacer of the interconnect assembly relative to the first circuit board.

Referring now to the FIGS., FIG. 1 depicts an inductive sensor 100 according to example embodiments of the present disclosure. As shown, the inductive sensor 100 can include a sensor element 110. The sensor element 110 can include a transmit coil 112 having one or more turns. The sensor element 110 can further include a plurality of receive coils 114. Each of the plurality of receive coils 114 can have one or more turns.

As shown, the plurality of receive coils 114 can include at least a first receive coil 116 and a second receive coil 118.

In some implementations, the first receive coil 116 can have a shape corresponding to a first sine wave. In addition, the second receive coil 118 can have a shape corresponding to a second sine wave that is phase-shifted relative to the first sine wave. In some implementations, the second sine wave can be phase-shifted relative to the first sine wave by 90 degrees. In such implementations, the first receive coil 116 and the second receive coil 118 can be a sine receive coil and a cosine receive coil, respectively. It should be appreciated that, in some implementations, the plurality of receive coils 114 can include more than two (e.g., first receive coil 116 and second receive coil 118) receive coils. For instance, in some implementations, the plurality of receive coils 114 can include three or more separate receive coils.

The inductive sensor 100 can include a target 120 that moves relative to the sensor element 110. The target 120 can be any object that includes metal. For instance, in some implementations, the target 120 can include a wire loop structure. In some implementations, the target 120 can be mounted to an object that moves relative to the sensor element 110. In some implementations, the object can be a rotor of an electric motor. In such implementations, the sensor element 110 can be mounted to a stator of the electric motor. It should be understood that, in some implementations, the target 120 can be integral with the rotor.

The inductive sensor 100 can include processing circuitry 130 associated with the sensor element 110. The processing circuitry 130 can include a transmission ("TX") drive circuit 132 configured to generate an alternating current signal that is provided to the transmit coil 112 of the sensor element 110. In some implementations, the TX drive circuit 132 can include a free running oscillator that generates the alternating current signal at a drive frequency determined by the inductance of the transmit coil 112 and the capacitance of a capacitor (not shown) connected in parallel to the transmit coil 112. In some implementations, the target 120 includes a resonant circuit and the drive frequency is set to the resonant frequency of that resonant circuit.

Supplying the alternating current signal to the transmit coil 112 induces electromotive forces in the first receive coil 116 (e.g., sine receive coil) and the second receive coil 118 (e.g., cosine receive coil), which causes current to flow in the first receive coil 116 and the second receive coil 118. However, due to a layout of the first receive coil 116 and the second receive coil 118 with respect to the layout of the transmit coil 112, the electromotive forces induced directly in the first receive coil 116 and the second receive coil 118 are negligible and therefore cause negligible current to flow in the first receive coil 116 and the second receive coil 118. However, the electromotive forces the transmit coil 112 induces in the plurality of receive coils 114 via the target 120 do cause current to flow in each of the plurality of receive coils 114 (e.g., the first receive coil 116 and the second receive coil 118).

In some implementations, each of the plurality of receive coils 114 can be formed from a separate winding such that a separate current flows in each of the plurality of receive coils 114. For instance, the first receive coil 116 and the second receive coil 118 can each be formed from separate windings such that separate currents flow in the first receive coil 116 and the second receive coil 118. Furthermore, the first receive coil 116 and the second receive coil 118 can be coupled to separate terminals (not shown) associated with the processing circuitry 130, with the current flowing in the first receive coil 116 being processed to provide a first output signal 150 and the current flowing in the second receive coil 118 being processed to provide a second output signal 152.

In some implementations, the processing circuitry 130 includes an EMC filtering circuit 134 associated with filtering harmonics associated with current flowing in the first receive coil 116. For instance, the EMC filtering circuit 134 can be associated with filtering harmonics at frequencies that are different than a drive frequency. In this manner, harmonics due to the interference from electrical signals generated by other nearby electrical components can be removed. The filtered electrical signal then goes through a synchronous demodulation circuit 136 in which the filtered electrical signal is mixed with a demodulation signal from the TX drive circuit 132.

The demodulated electrical signal then passes through a low pass filter 138 configured to remove the high frequency components leaving the baseband component, and then passes through a gain and output buffer circuit 140, which allows an adjustable gain to be applied before being output as the first output signal 150. It should be understood that the induced signal from the second receive coil 118 also undergoes the EMC filtering circuit 134, the synchronous demodulation circuit 136, the low pass filter 138, and the gain and output buffering circuit 140 before being output as the second output signal 152.

In some implementations, a position of the target 120 relative to the sensor element 110 can be determined based, at least in part, on the first output signal 150 and the second output signal 152. For instance, the position of the target 120 relative to the sensor element 110 can correspond to the arc tangent of the first output signal 150 divided by the second output signal 152. In such implementations, one or more processors 142 of the processing circuitry 130 can be configured to output a signal indicative of the position of the target 120 relative to the sensor element 110. Alternatively and/or additionally, the one or more processors can be configured to output a signal indicative of a speed of the target 120 based, at least in part, on the first output signal 150 and the second output signal 152. In some implementations, the speed of the target 120 and/or position of the target 120 relative to the sensor element 110 can be calculated by one or more processors that are remote relative to the inductive sensor 100.

In some implementations, the processing circuitry 130 can include one or more sensors 144. For instance, in some implementations, the one or more sensors 144 can include temperature sensors configured to monitor a temperature of an environment in which the inductive sensor 100 is located. Alternatively and/or additionally, the one or more sensors 144 can include one or more motion sensors (e.g., accelerometer). Furthermore, in some implementations, the processing circuitry 130 can include one or more communication interfaces 146 configured to facilitate communication with the sensor element 110 and/or one or more devices that are remote relative to the inductive sensor 100. It should be appreciated that the one or more communication interfaces 146 can include any suitable wired or wireless interface.

In some implementations, the TX drive circuit 132, the EMC filtering circuit 134, the synchronous demodulation circuit 136, the low pass filter 138, and the gain and output buffering circuit 140 can each be implemented as a single integrated circuit. Furthermore, in some implementations, the one or more processors 142, the one or more sensors 144 and the one or more communication interfaces 146 can be included within the integrated circuit.

Figure 2:
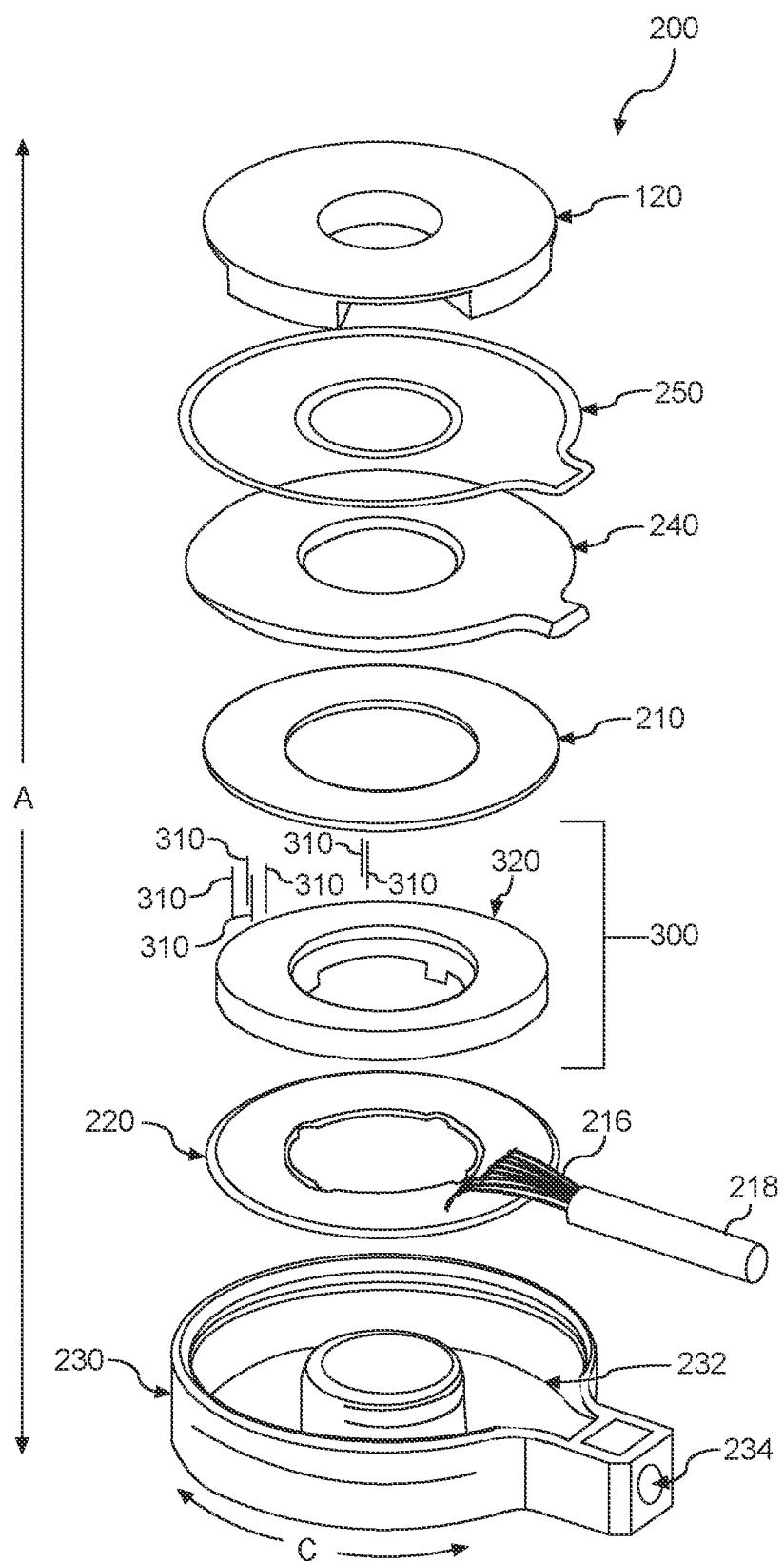
FIG. 2 depicts an exploded view of components of an inductive sensor according to example embodiments of the present disclosure.
Figure 3:
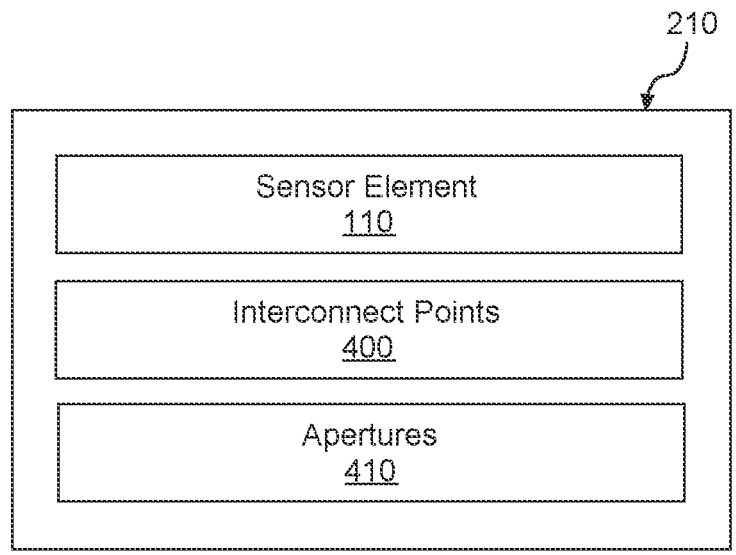
FIG. 3 depicts components of a first circuit board of an inductive sensor according to example embodiments of the present disclosure.
Figure 4:
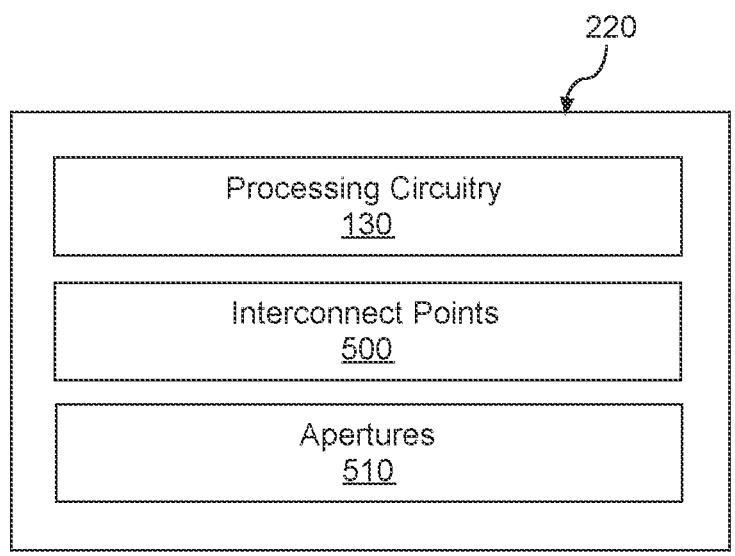
FIG. 4 depicts components of a second circuit board of an inductive sensor according to example embodiments of the present disclosure.

Referring now to FIGS. 2 through 4, components of an inductive sensor 200 are provided according to example embodiments of the present disclosure. As shown, the inductive sensor 200 defines a coordinate system that includes an axial direction A, a circumferential direction C and a radial direction (not shown). The inductive sensor 200 can include a first circuit board 210 on which the sensor element 110 discussed above with reference to FIG. 1 is disposed. The inductive sensor 200 can further include a second circuit board 220 that is spaced apart from the first circuit board 210 along the axial direction A. Furthermore, one or more electronic components (e.g., processors, sensors, etc.) of the processing circuitry 130 discussed above with reference to FIG. 1 can be disposed on the second circuit board 220. For instance, in some implementations, the one or more processors 142 of the processing circuitry 130 can be disposed on the second circuit board 220. Alternatively and/or additionally, the one or more sensors 144 associated with the processing circuitry 130 can be disposed on the second circuit board 220. Still further, in some implementations, the one or more communication interfaces 146 can be disposed on the second circuit board 220.

In some implementations, the inductive sensor 200 can include a housing 230 defining a cavity 232 in which the first circuit board 210 and the second circuit board 220 can be disposed. For instance, in some implementations, the first circuit board 210 and the second circuit board 220 can be positioned within the cavity 232 of the housing 230 such that the first circuit board 210 and the second circuit board 220 are stacked along the axial direction A. In some implementations, the housing 230 can define an opening 234 configured to accommodate a plurality of conductors (e.g., wires) or connectors 216 coupled to the second circuit board 220. As shown, the plurality of connectors 216 can be at least partially disposed within a screen or sheath 218. In particular, a portion of each of the plurality of connectors 216 passing through the opening 234 defined by the housing 230 can be disposed within the sheath 218.

It should be appreciated that, in some implementations, the second circuit board 220 can include a plurality of terminals 520 (FIG. 6) to which the plurality of connectors 216 can be connected. In this manner, electrical communication between the processing circuitry 130 on the second circuit board 220 and one or more electronic devices coupled to the plurality of connectors 216 can be provided.

In some implementations, the inductive sensor 200 can include a cover 240 positioned on the housing 230 to enclose the first circuit board 210 and the second circuit board 220 within the cavity 232 defined by the housing 230. In this manner, the circuit boards (e.g., first circuit board 210 and second circuit board 220) disposed within the cavity 232 defined by the housing 230 can be shielded from an external environment in which the inductive sensor 200 is located. Furthermore, in some implementations, the inductive sensor 200 can include a gasket 250 positioned on the housing 230 to provide a seal between the housing 230 and the cover 240.

It should be understood that the cover 240 can be removed (e.g., decoupled) from the housing 230 to allow a user to access to the first circuit board 210 and the second circuit board 220. In this manner, the user can, as will be discussed below in more detail, swap out the first circuit board 210 and/or the second circuit board 220 as needed to accommodate different configurations of electric motors or generators. It should also be appreciated that the housing 230 can be formed from any suitable material. For instance, in some implementations, the housing 230 can be formed from metal.

Figure 5:
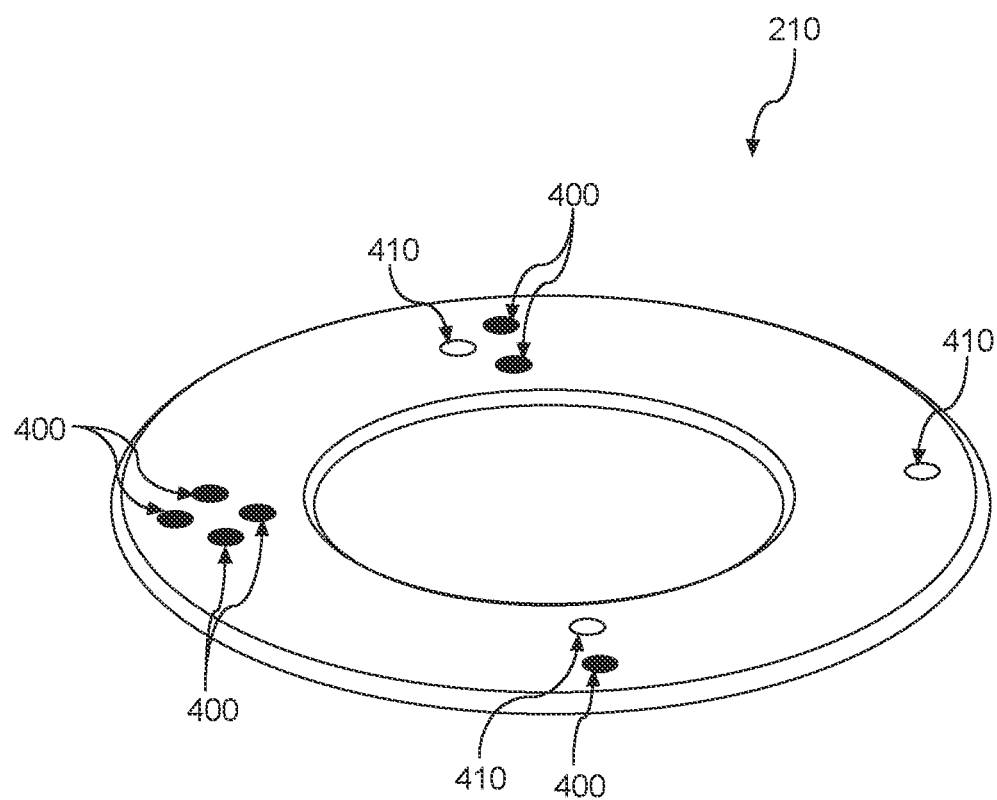
FIG. 5 depicts a perspective view of a first circuit board of the inductive sensor of FIG. 2 according to example embodiments of the present disclosure.
Figure 6:
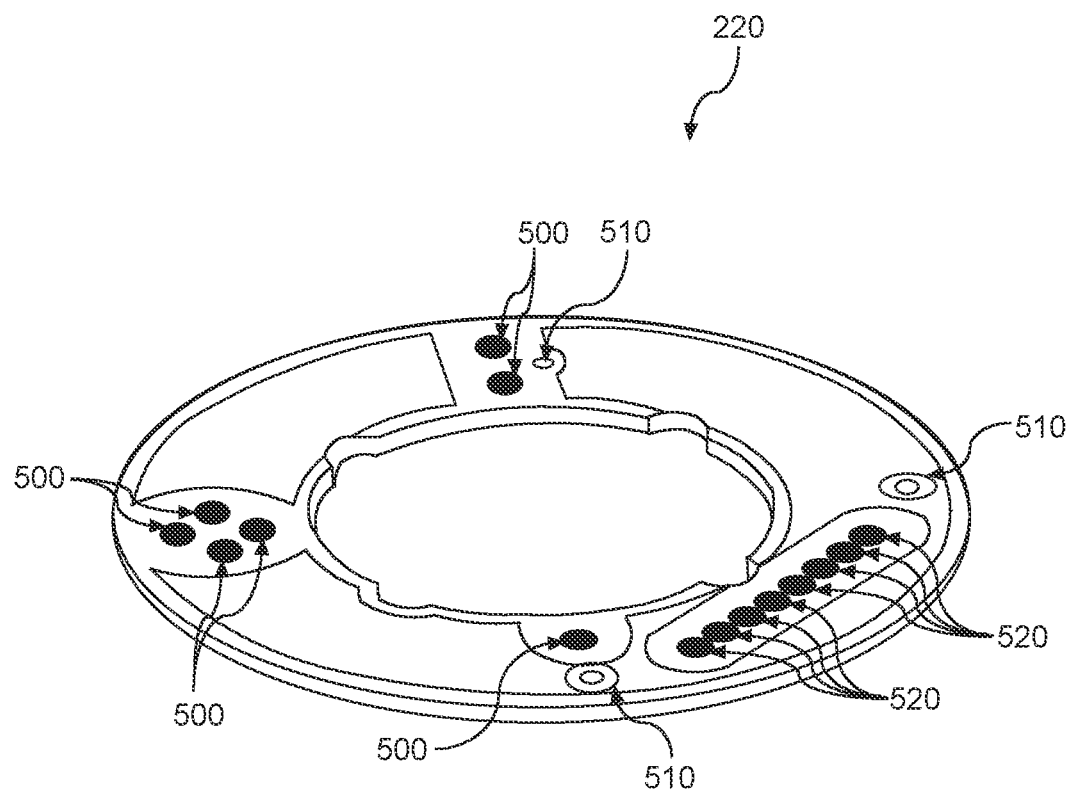
FIG. 6 depicts a perspective view of a second circuit board of the inductive sensor of FIG. 2 according to example embodiments of the present disclosure.

Referring briefly now to FIGS. 5 and 6, the first circuit board 210 and the second circuit board 220 can each include a plurality of interconnect points 400, 500. In some implementations, the first circuit board 210 and the second circuit board 220 can each include the same number of interconnect points 400, 500. It should be understood that each of the plurality of the plurality of interconnect points 500 on the second circuit board 220 is aligned with a corresponding interconnect point of the plurality of interconnect points 400 on the first circuit board 210 along the circumferential direction C and the radial direction R.

In some implementations, the plurality of interconnect points 400, 500 can include a plurality of solder pads. It should be appreciated, however, that the plurality of interconnect points 400, 500 can include any suitable type of connection to facilitate electrical communication between the two circuit boards (e.g., first circuit board 210 and second circuit board 220) of the inductive sensor 200. As will be discussed below in more detail, the inductive sensor 200 can, in some implementations, include an interconnect assembly 300 (FIG. 2) configured to electrically couple the first circuit board 210 to the second circuit board 220 to facilitate electrical communication between the sensor element 110 (FIG. 1) on the first circuit board 210 and the processing circuitry 130 (FIG. 1) on the second circuit board 220.

Figure 7:
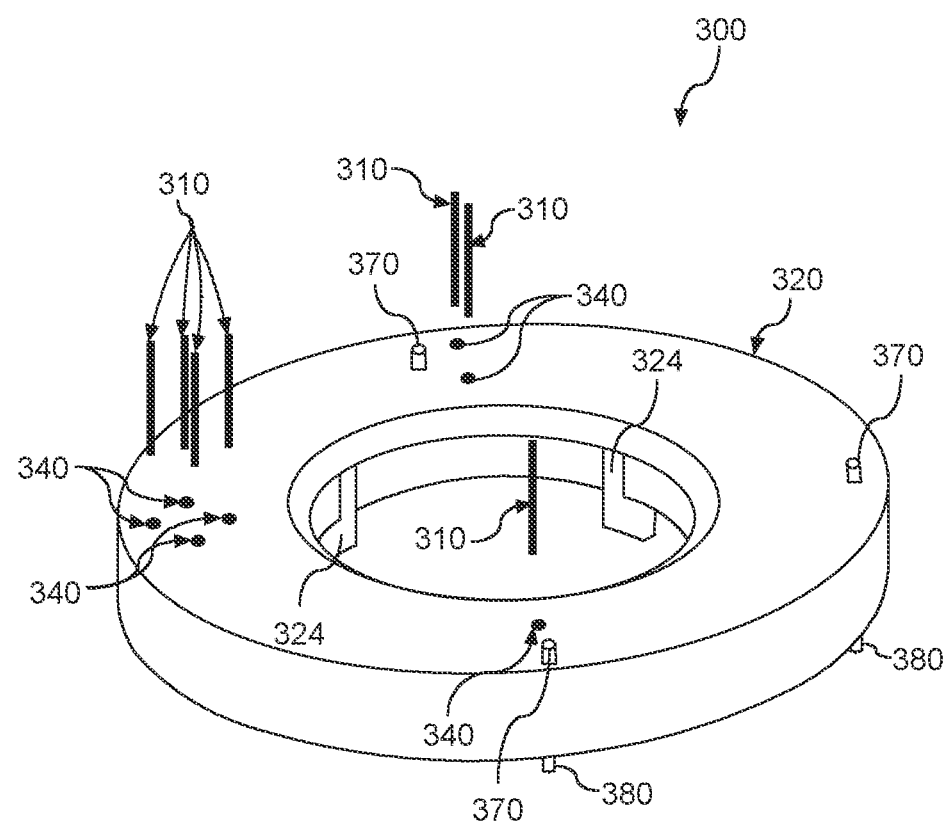
FIG. 7 depicts an interconnect assembly for an inductive sensor according to example embodiments of the present disclosure.
Figure 8:
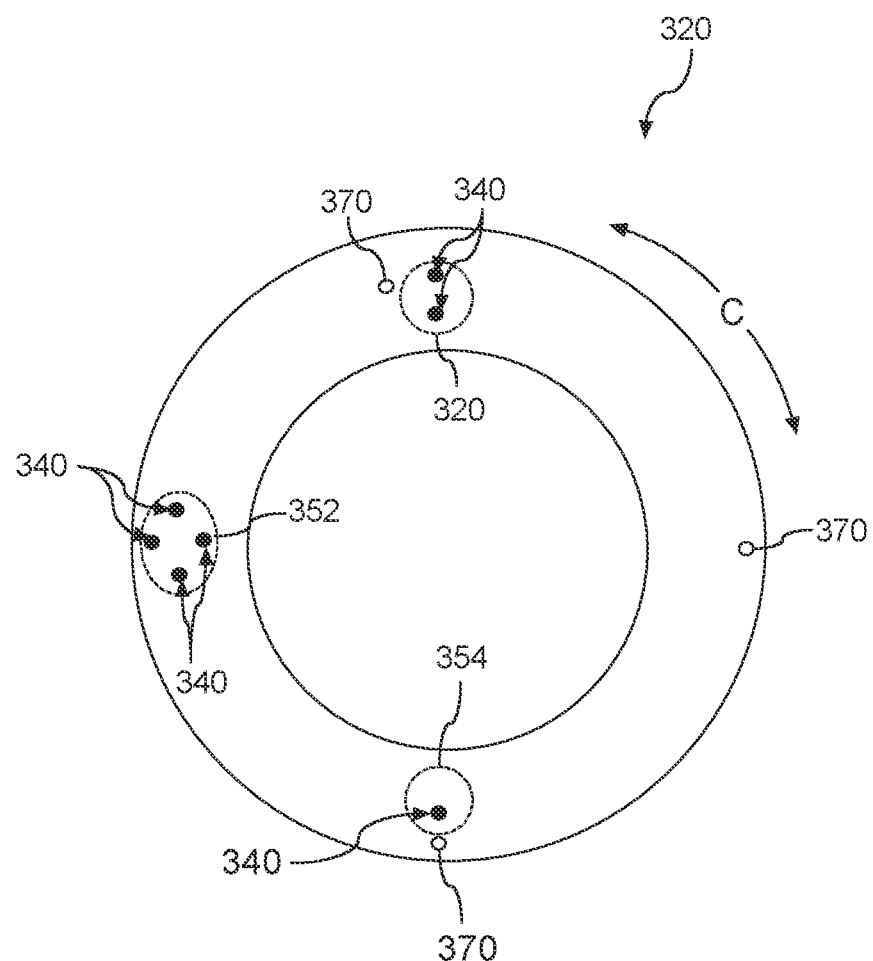
FIG. 8 depicts a top view of a spacer of an interconnect assembly for an inductive sensor according to example embodiments of the present disclosure.
Figure 9:
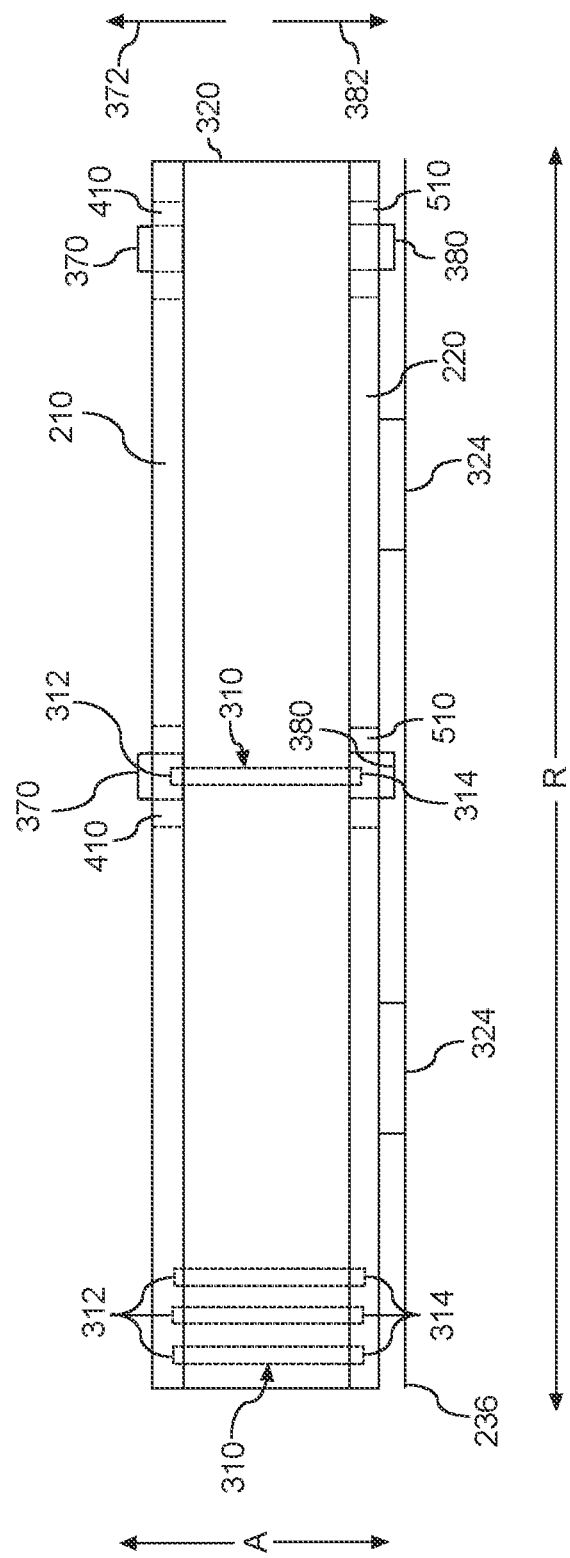
FIG. 9 depicts an interconnect assembly positioned between a first circuit board of an inductive sensor and a second circuit board of an inductive sensor according to example embodiments of the present disclosure.

Referring now to FIGS. 7 through 9, the interconnect assembly 300 can include a plurality of conductive pins 310. The plurality of conductive pins 310 can be coupled between the first circuit board 210 and the second circuit board 220. In this manner, the first circuit board 210 and the second circuit board 220 can be in electrical communication with one another via the plurality of conductive pins 310. For instance, in some implementations, a first end 312 of each of the plurality of conductive pins 310 can be connected to a corresponding interconnect point of the plurality of interconnect points 400 on the first circuit board 210. Additionally, a second end 314 of each of the plurality of conductive pins 310 can be connected to a corresponding interconnect point of the plurality of interconnect points 500 on the second circuit board 220.

It should be appreciated that the plurality of conductive pins 310 can be connected to the plurality of interconnect points 400, 500 on the first circuit board 210 and the second circuit board 220, respectively, in any suitable manner. For instance, in some implementations, the first end 312 of each of the plurality of conductive pins 310 can be soldered to a corresponding interconnect point of the plurality of interconnect points 400 (FIG. 3) on the first circuit board 210. Likewise, the second end 314 of each of the plurality of conductive pins 310 can be soldered to a corresponding interconnect point of the plurality of interconnect points 500 (FIG. 4) on the second circuit board 220.

In some implementations, the interconnect assembly 300 can include a spacer 320 positioned between the first circuit board 210 and the second circuit board 220 along the axial direction A. In this manner, the first circuit board 210 can be spaced apart from the second circuit board 220 via the spacer 320. As shown, the spacer 320 can have an annular shape. It should be appreciated, however, that the spacer 320 can have any suitable shape.

In some implementations, the spacer 320 can include one or more feet 324. Furthermore, in implementations in which the spacer 320 includes multiple feet 324, the feet 324 can be spaced apart from one another along the circumferential direction C. It should be understood that the feet 324 can contact a bottom wall 236 of the housing 230 (FIG. 2) such that the second circuit board 220 is spaced apart from the bottom wall 236 of the housing 230 along the axial direction A. In this manner, the second circuit board 220 does not contact the bottom wall 236 of the housing 230 when the second circuit board 220 is positioned within the cavity 232 defined by the housing 230.

As shown, the spacer 320 can define a plurality of apertures 340. It should be appreciated that each of the plurality of apertures 340 is aligned with a corresponding interconnect point of the plurality of interconnect points 400, 500 on the first circuit board 210 and the second circuit board 220, respectively, along the circumferential direction C and the radial direction R. In this manner, each of the plurality of apertures 340 can be configured to accommodate a corresponding conductive pin of the plurality of conductive pins 310 coupled between the first circuit board 210 and the second circuit board 220.

In some implementations, the plurality of apertures 340 can be divided into a plurality of groups. Furthermore, each of the groups can be located at different location on the spacer 320. For instance, as shown in FIG. 8, the plurality of apertures 340 can be divided into three separate groups. More specifically, a first group 350 of apertures 340 can be positioned at a first location on the spacer 320. A second group 352 of apertures 340 can be positioned at a second location on the spacer 320 that is spaced apart from the first location along the circumferential direction C by about 90 degrees. A third group 354 of apertures 340 can be positioned at a third location on the spacer 320 that is spaced apart from the first location along the circumferential direction C by about 180 degrees. As shown, a number of apertures 340 included in each of the three groups (e.g., first group 350, second group 352 and third group 354) can be different. However, it should be appreciated that, in alternative implementations, the number of apertures 340 included in each of the groups can be the same.

In some implementations, the spacer 320 can include one or more posts 370 extending along the axial direction A in a first direction 372 such that the one or more posts 370 extend through a corresponding aperture of a plurality of apertures 410 defined by the first circuit board 210. In this manner, movement of the first circuit board 210 along at least one direction (e.g., radial direction) can be limited via the spacer 320. Alternatively and/or additionally, the spacer 320 can include one or more posts 380 along the axial direction A in a second direction 382 that is different than the first direction 372 such that the one or more posts 380 extend through a corresponding aperture of a plurality of apertures 510 defined by the second circuit board 220. In this manner, movement of the second circuit board 220 along at least one direction (e.g., radial direction) can be limited via the spacer 320.

Figure 10:
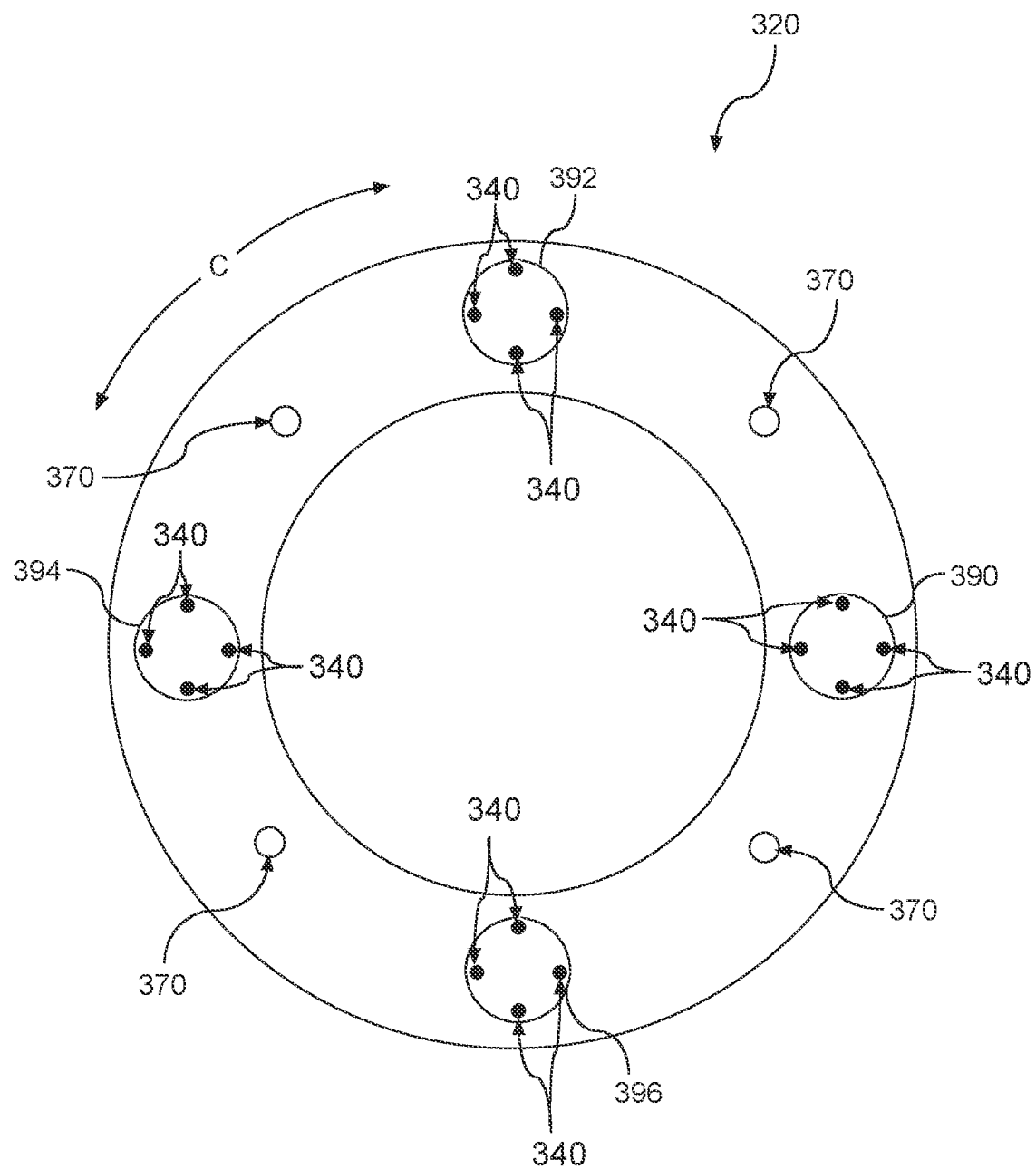
FIG. 10 depicts a top view of a spacer of an interconnect assembly for an inductive sensor according to example embodiments of the present disclosure.
Figure 11:
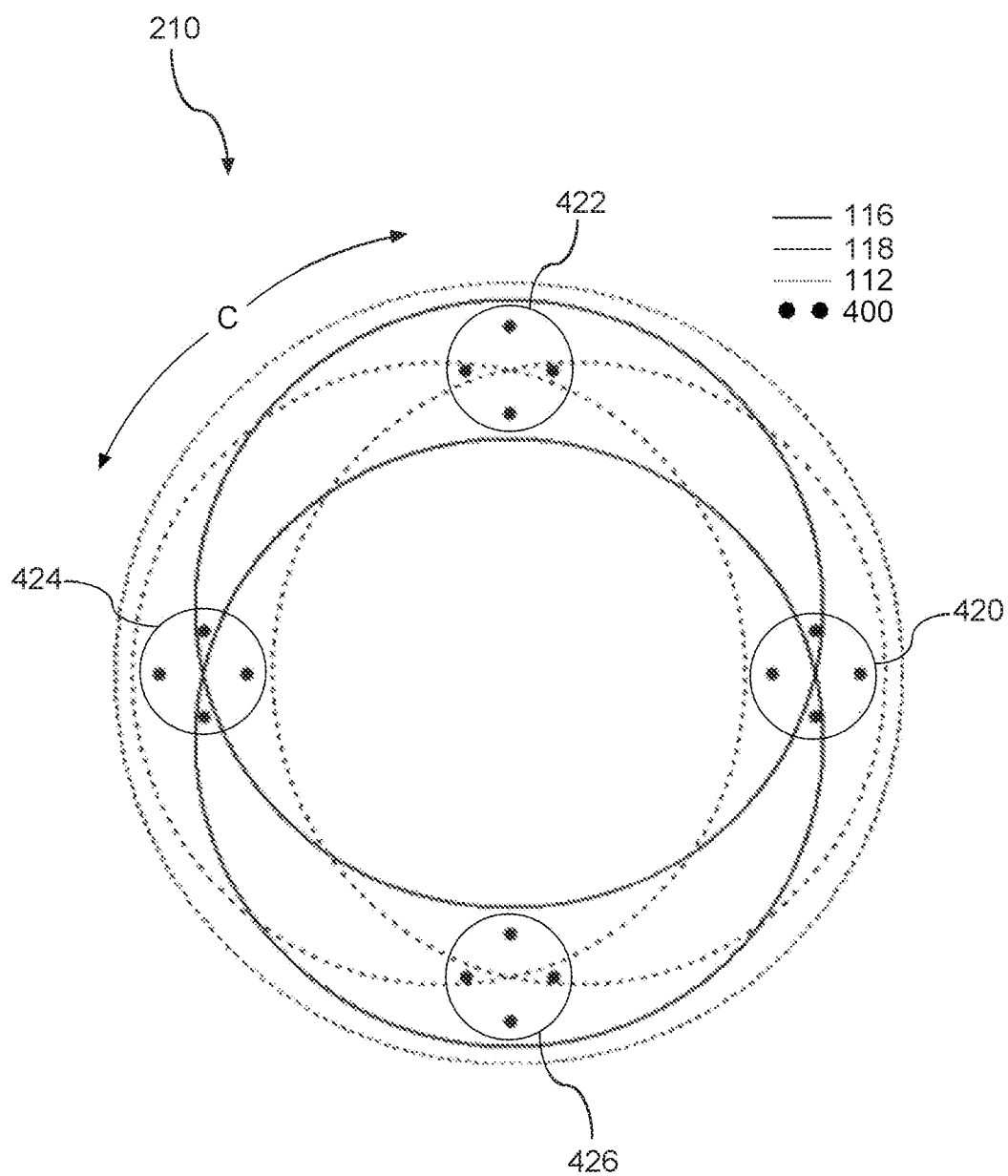
FIG. 11 depicts a first circuit board of an inductive sensor having a first coil configuration according to example embodiments of the present disclosure.
Figure 12:
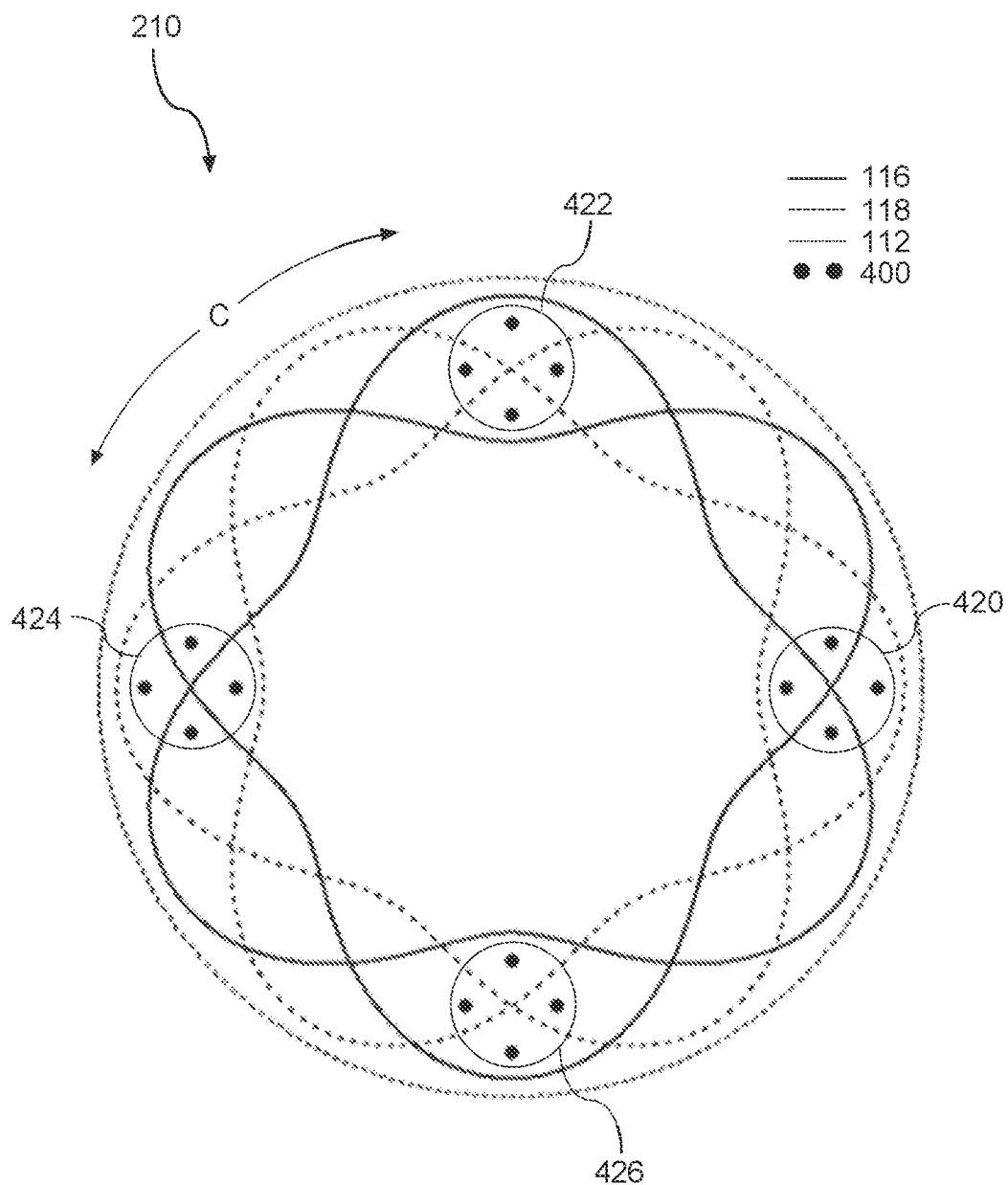
FIG. 12 depicts a first circuit board of an inductive sensor having a second coil configuration according to example embodiments of the present disclosure.
Figure 13:
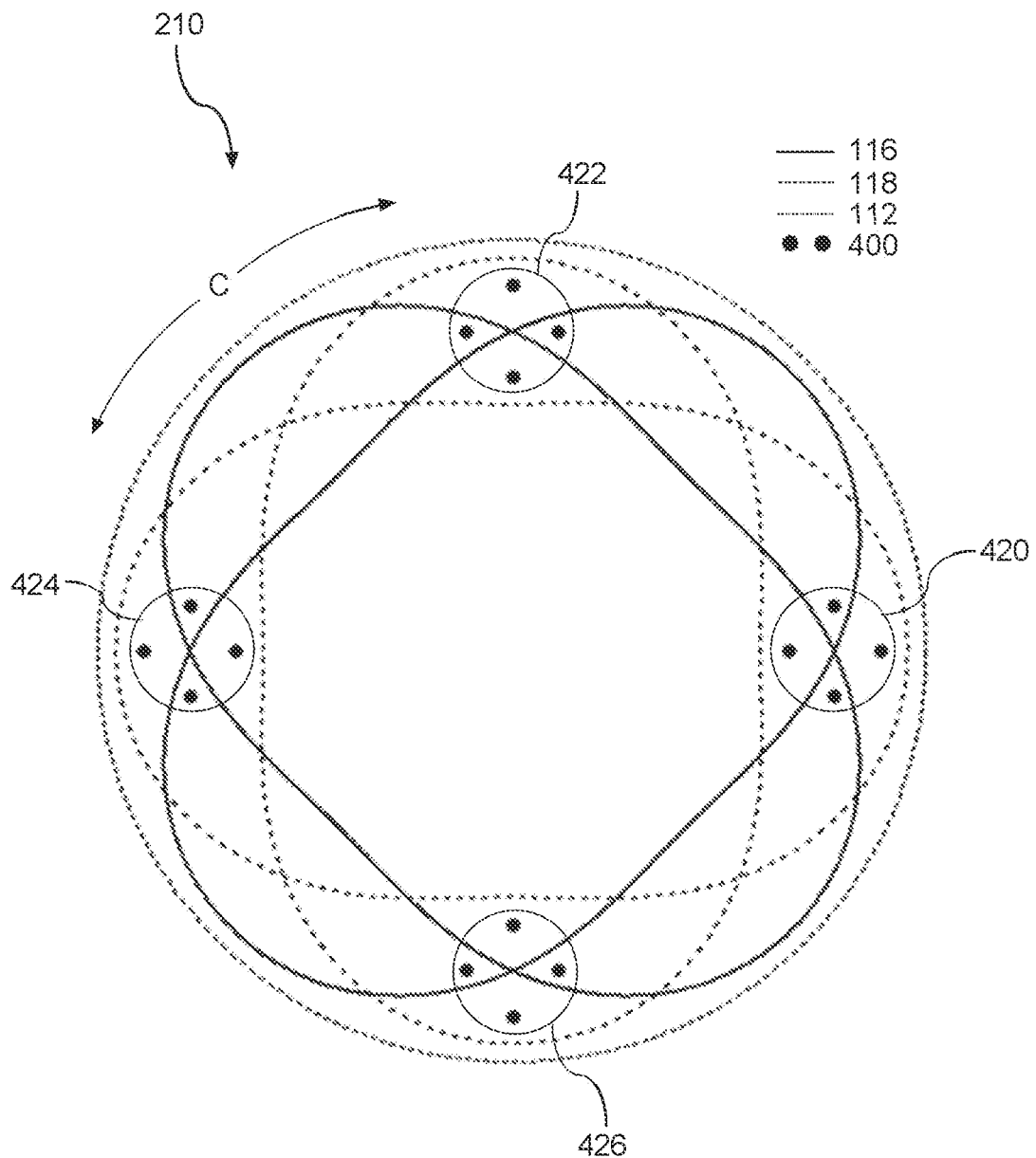
FIG. 13 depicts a first circuit board of an inductive sensor having a third coil configuration according to example embodiments of the present disclosure.
Figure 14:
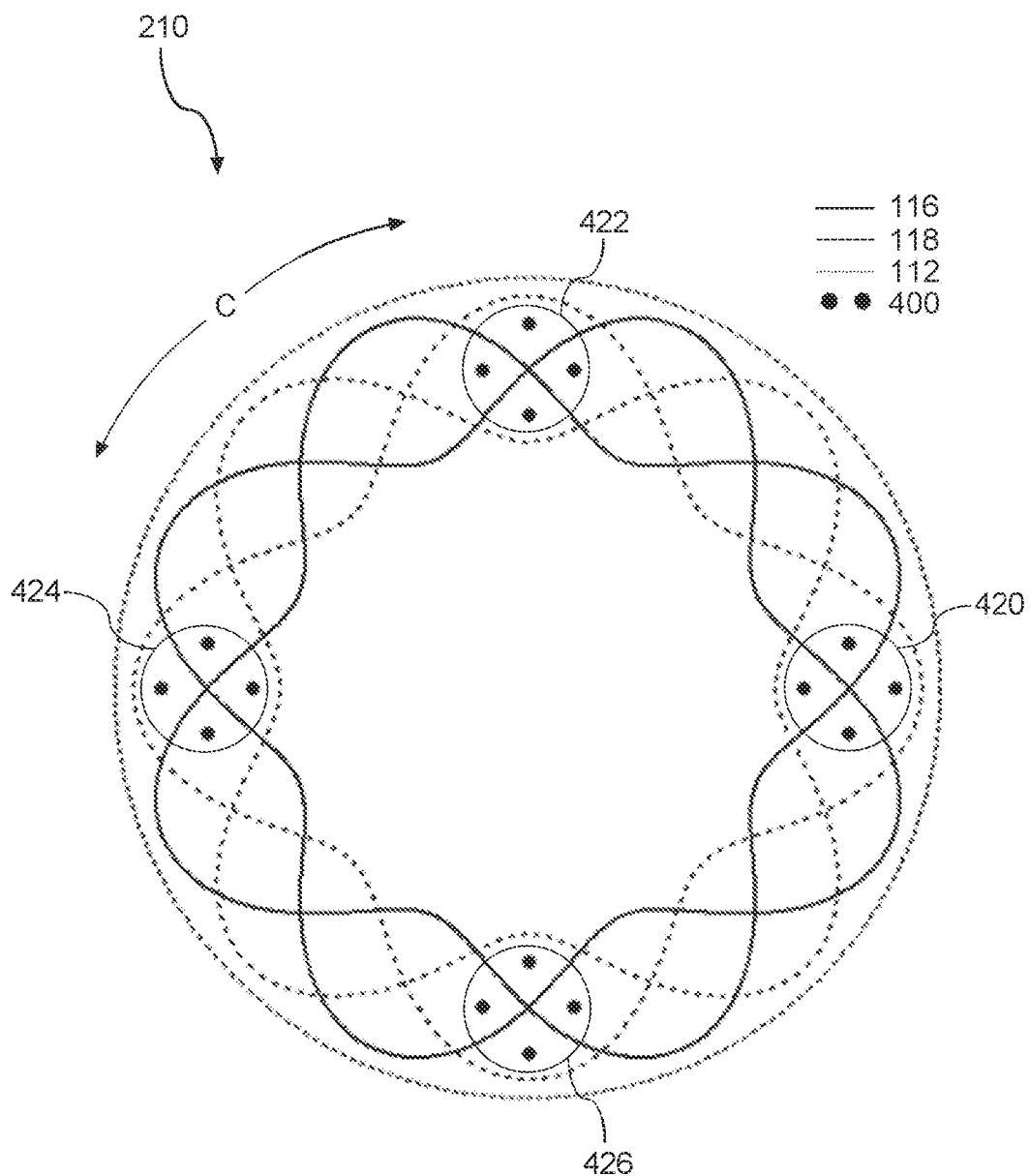
FIG. 14 depicts a first circuit board of an inductive sensor having a fourth coil configuration according to example embodiments of the present disclosure.
Figure 15:
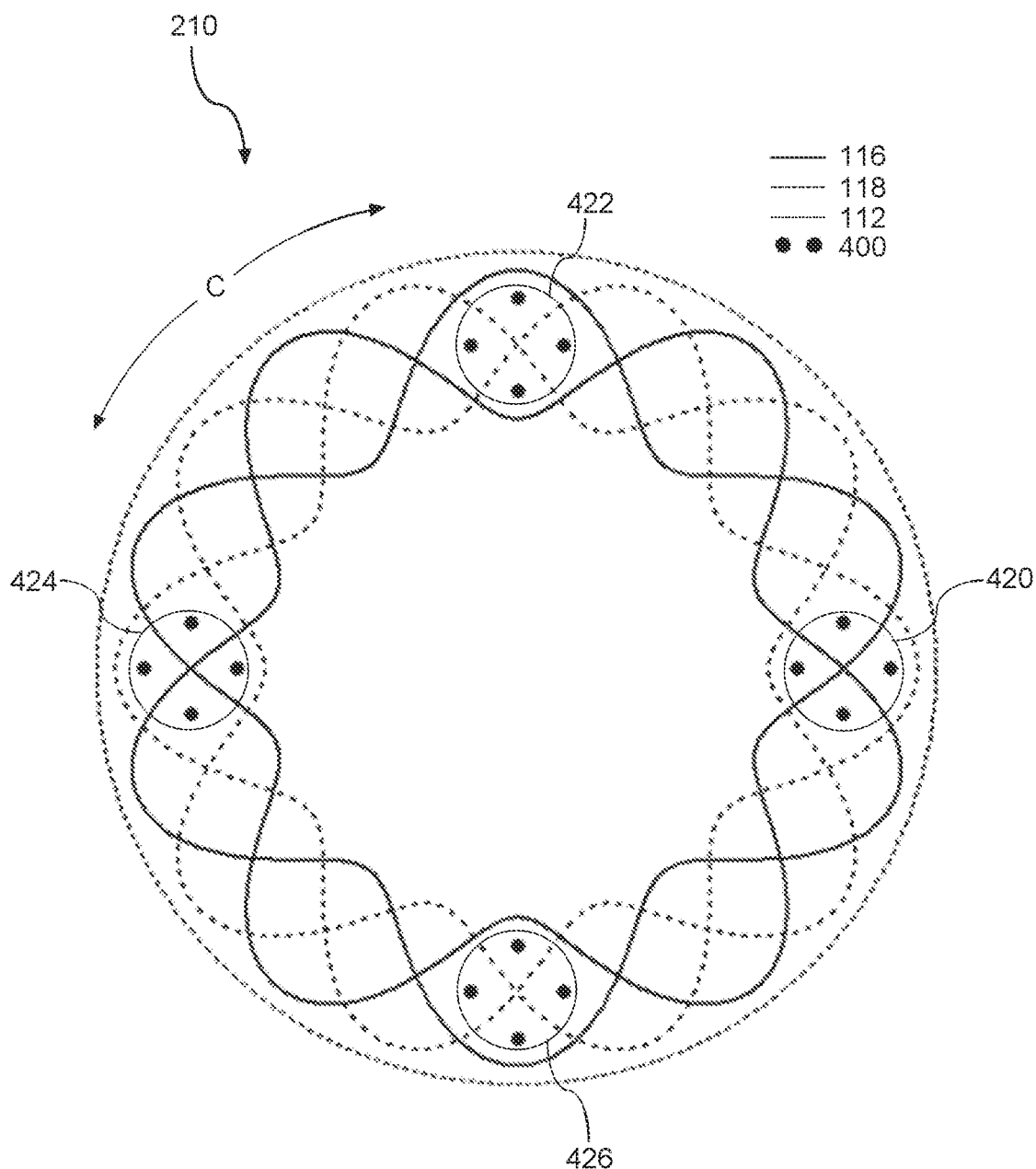
FIG. 15 depicts a first circuit board of an inductive sensor having a fifth coil configuration according to example embodiments of the present disclosure.
Figure 16:
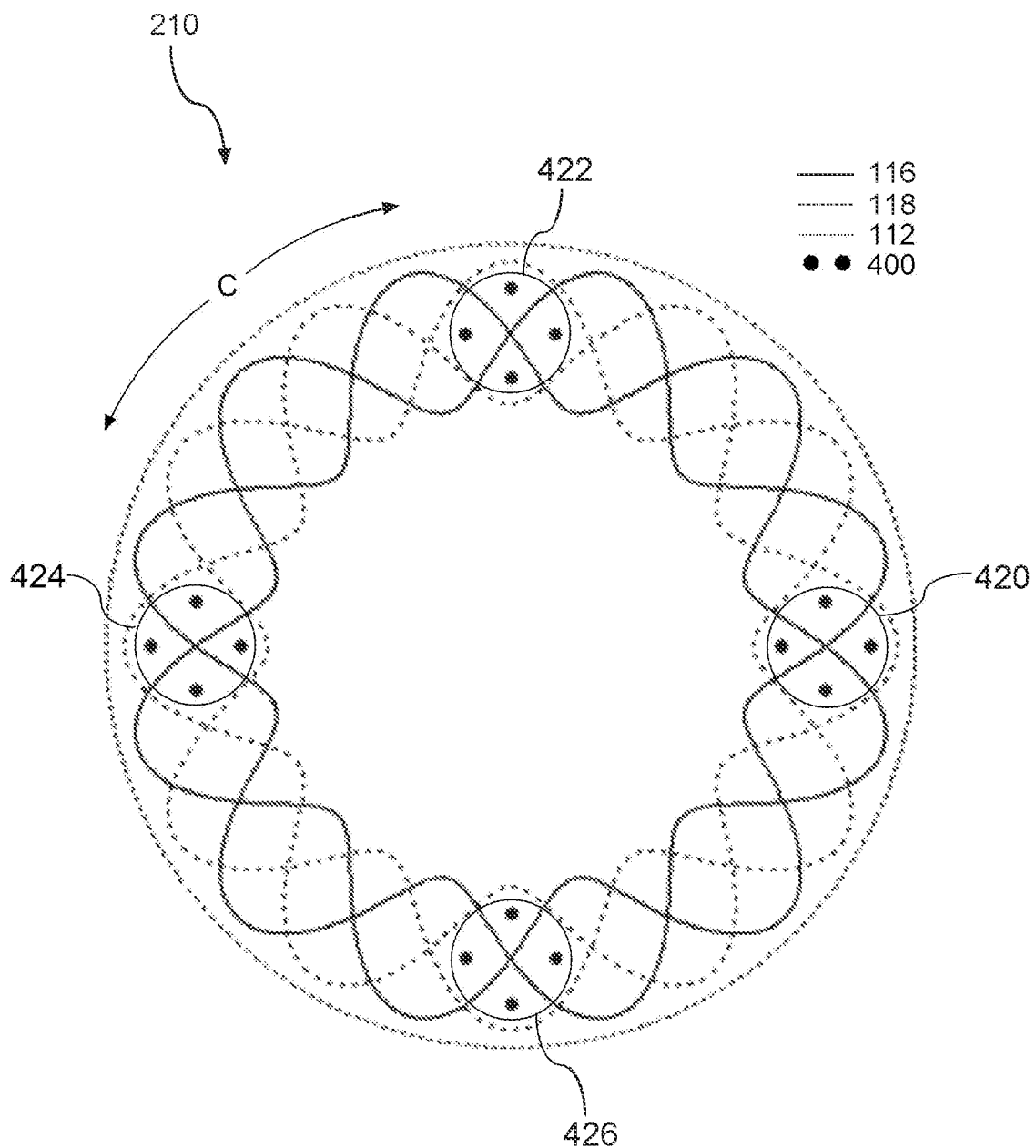
FIG. 16 depicts a first circuit board of an inductive sensor having a sixth coil configuration according to example embodiments of the present disclosure.
Figure 17:
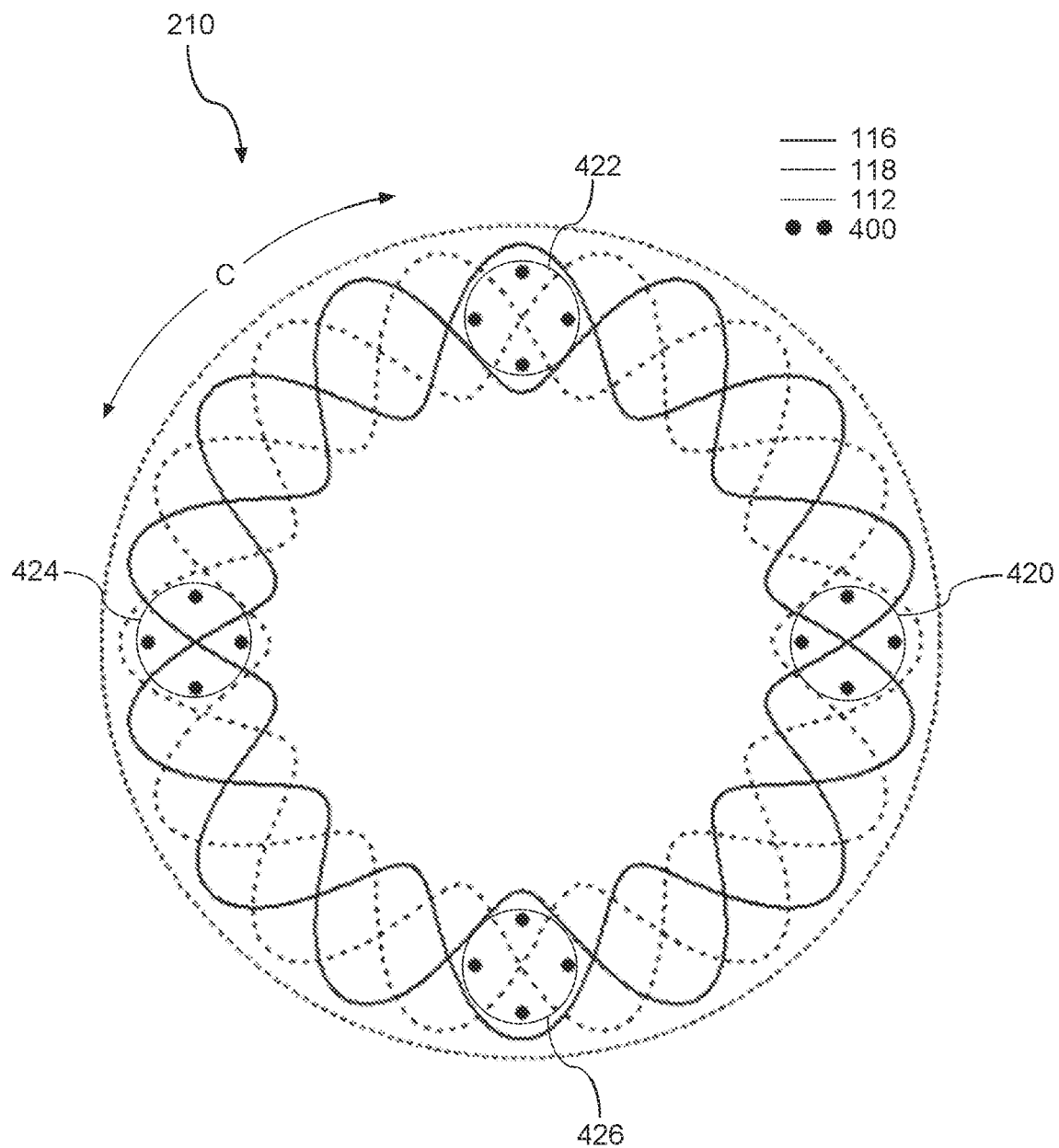
FIG. 17 depicts a first circuit board of an inductive sensor having a seventh coil configuration according to example embodiments of the present disclosure.

Referring now to FIG. 10, a top view of another embodiment of the spacer 320 is provided according to the present disclosure. The spacer 320 has an annular shape (e.g., circular). It should be appreciated, however, that the spacer 320 can have any suitable shape. It should also be appreciated that each of the plurality of apertures 340 configured to accommodate the plurality of conductive pins 310 can be aligned with a corresponding interconnect point of the plurality of interconnect points 400, 500 (FIGS. 5 and 6) on the first circuit board 210 and the second circuit board 220, respectively, along the radial direction R and the circumferential direction C. Furthermore, as will be discussed below in more detail, the plurality of apertures 340 can be divided into a plurality of groups. Still further, each of the plurality of groups can be disposed at a different location on the spacer 320.

As shown, the plurality of apertures 340 can be divided into a first group 390 of apertures 340, a second group 392 of apertures 340, a third group 394 of apertures 340, and a fourth group 396 of apertures 340. The first group 390 of apertures 340 can be disposed at a first location on the spacer 320. The second group 392 of apertures 340 can be disposed at a second location on the spacer 320 that is spaced apart from the first location along the circumferential direction C by about 90 degrees. The third group 394 of apertures 340 can be disposed at a third location on the spacer 320 that is spaced apart from the first location along the circumferential direction C by about 180 degrees. The fourth group 396 of apertures 340 can be disposed at a fourth location on the spacer 320 that is spaced apart from the first location along the circumferential direction C by about 270 degrees.

Figure 18:
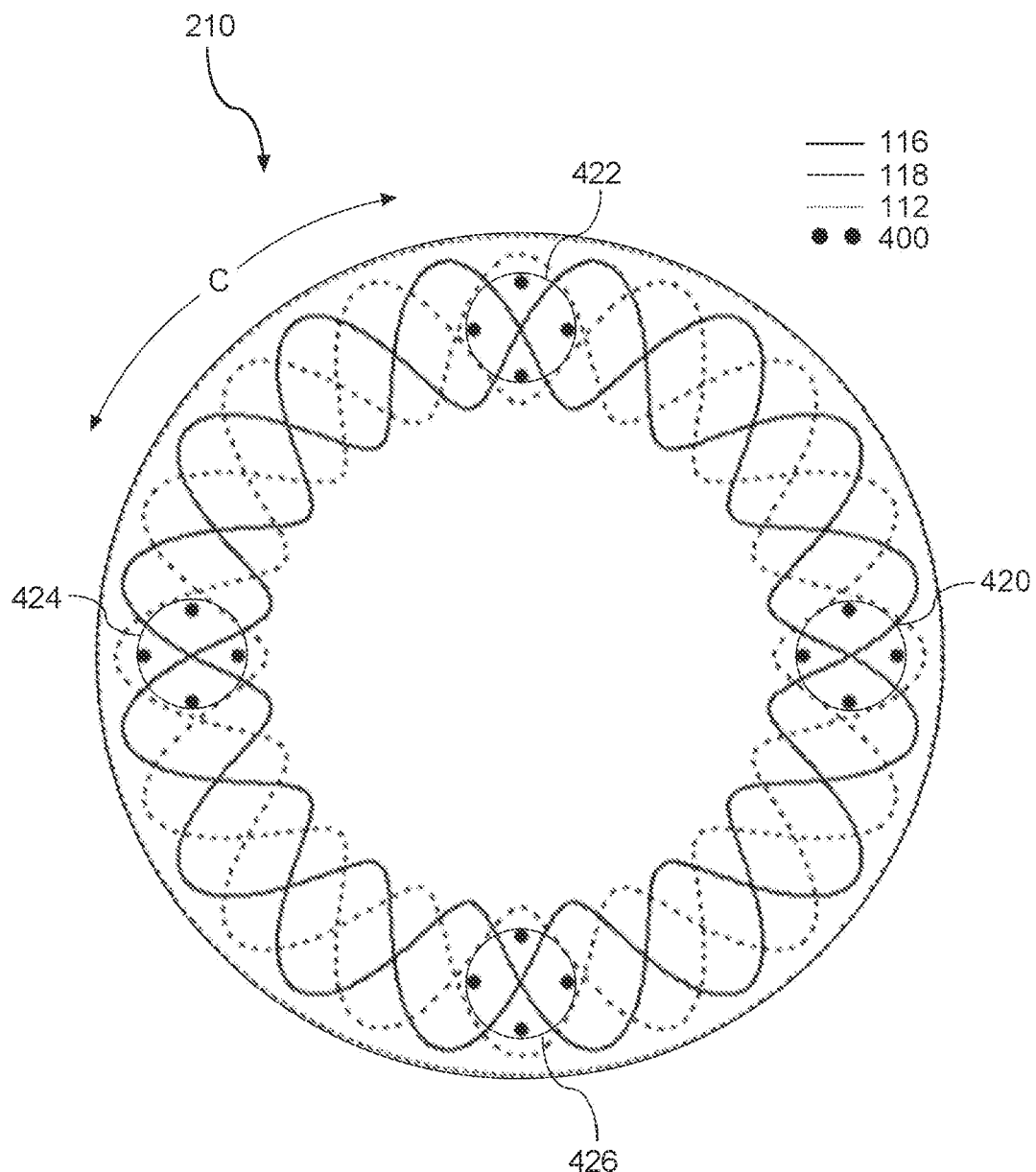
FIG. 18 depicts a first circuit board of an inductive sensor having an eight coil configuration according to example embodiments of the present disclosure.

Referring now to FIGS. 11-18, the sensor element 110 (FIGS. 1 and 3) disposed on the first circuit board 210 can be configurable in a plurality of different coil configurations to accommodate different types (e.g., pole-pair configurations) of electric motors. FIG. 10-17 depicts the sensor element 110 disposed on the first circuit board 210 arranged according to a first coil configuration (FIG. 11), a second coil configuration (FIG. 12), a third coil configuration (FIG. 13), a fourth coil configuration (FIG. 14), a fifth coil configuration (FIG. 15), a sixth coil configuration (FIG. 16), a seventh coil configuration (FIG. 17), and an eight coil configuration (FIG. 18). It should be appreciated, however, that the sensor element 110 can be configurable in any suitable number of different coil configurations. For instance, in some implementations, the sensor element 110 can be configurable in more (e.g. greater than 8) or fewer (e.g. less than 8) coil configurations. As will be discussed below, a location of the plurality of interconnect points 400 on the first circuit board 210 can be the same (e.g., fixed) for each of the plurality of coil configurations of the sensor element 110. In this manner, the first circuit board 210 having a sensor element 110 arranged thereon according to one coil configuration of the plurality of coil configurations can be changed out for the first circuit board 210 having the sensor element arranged thereon according to a different coil configuration of the plurality of coil configurations without having to change or modify the interconnect assembly 300 (FIG. 7). It should be appreciated that, in some implementations, a pattern associated with each of the different coil configurations can begin at a same location on the first circuit board 210.

In some implementations, the plurality of interconnect points 400 on the first circuit board 210 can be divided into a plurality of groups. Furthermore, each of the plurality of groups can be disposed at a different location on the first circuit board 210. For instance, in some implementations, the plurality of interconnect points can be divided into a first group 420 of interconnect points 400, a second group 422 of interconnect points 400, a third group 424 of interconnect points 400, and a fourth group 426 of interconnect points 400. The first group 420 of interconnect points 400 can be disposed at a first location on the first circuit board 210. The second group 422 of interconnect points 400 can be disposed at a second location on the first circuit board 210 that is spaced apart from the first location along the circumferential direction C by about 90 degrees. The third group 424 of interconnect points 400 can be disposed at a third location on the first circuit board 210 that is spaced apart from the first location along the circumferential direction C by about 180 degrees. The fourth group 426 of interconnect points 400 can be disposed at a fourth location on the first circuit board 210 that is spaced apart from the first location along the circumferential direction C by about 270 degrees.

It should be appreciated that the location of each of the plurality of groups (e.g., first group 420, second group 422, third group 424, fourth group 426) of interconnect points 400 can allow the first circuit board 210 to accommodate each of the plurality of coil configurations without having to change a location of the plurality of interconnect points 400 on the first circuit board 210. In this manner, the first circuit board 210 having the first coil configuration (FIG. 11) to accommodate a first electric motor can be changed out with the first circuit board 210 having a second coil configuration to accommodate a second electric motor without having the change or modify the interconnect assembly 300.

In some implementations, the first group 420 of interconnect points 400, the second group 422 of interconnect points 400, the third group 424 of interconnect points 400, and the fourth group 426 of interconnect points 400 can each include the same number of interconnect points 400. For instance, the first group 420 of interconnect points 400, the second group 422 of interconnect points 400, the third group 424 of interconnect points 400, and the fourth group 426 of interconnect points 400 can each include four interconnect points 400. Furthermore, in some implementations, the four interconnect points 400 included in each of the first group 420, the second group 422, the third group 424, and the fourth group 426 can be arranged in a diamond configuration. It should be appreciated, however, that the interconnect points 400 included in each of the plurality of groups can be arranged according to any suitable configuration.

Although FIGS. 11-18 are discussed with reference to the plurality of interconnect points 400 on the first circuit board 210, it should be appreciated that the plurality of interconnect points 500 on the second circuit board 220 can be arranged in a similar manner. For instance, in some implementations, the processing circuitry 130 can include a first group of electronic components (e.g., sensors, processors, communication interface, etc.) arranged on the second circuit board 220 according to a first configuration or layout. Alternatively, the processing circuitry 130 can include a second group of electronic components that is different than the first group of electronic components and is arranged on the second circuit board 220 according to a second configuration or layout that is different than the first configuration.

It should be understood that a location of the plurality of interconnect points 500 on the second circuit board 220 can be the same (i.e. fixed) for each of the plurality of different configurations of the processing circuitry 130. In this manner, the second circuit board 220 having processing circuitry 130 arranged thereon according to a first configuration can be changed out with the second circuit board 220 having processing circuitry 130 arranged thereon according to a second configuration without having to change or modify the interconnect assembly 300 (FIG. 7). It should also be understood that each of the plurality of interconnect points 500 on the second circuit board 220 is aligned with a corresponding interconnect point of the plurality of interconnect points 400 on the first circuit board 210 along the radial direction R and the circumferential direction C.

Figure 19:
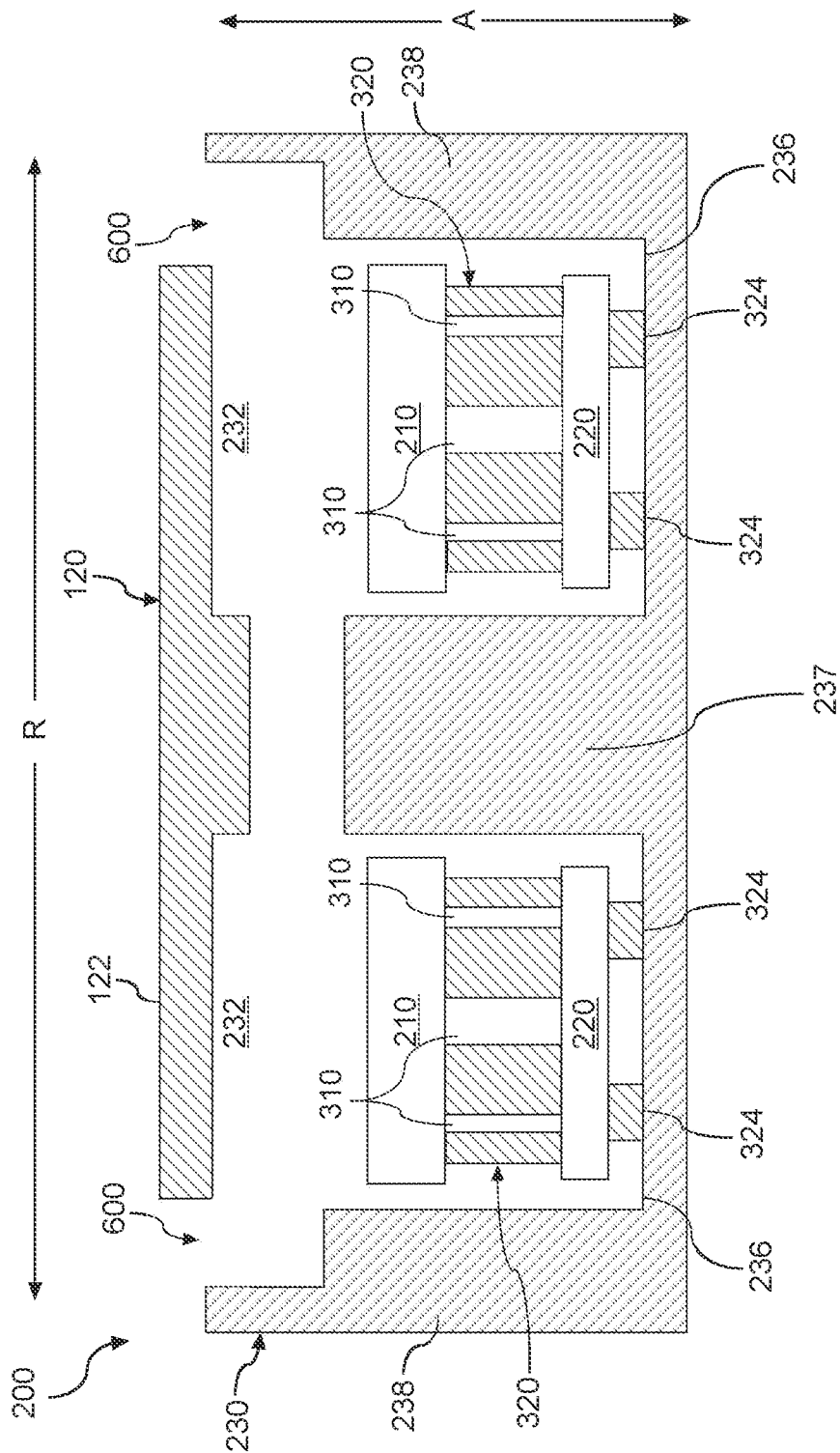
FIG. 19 depicts a cross-sectional view of an inductive sensor according to example embodiments of the present disclosure.

Referring now to FIG. 19, the target 120 of the inductive sensor 200 can, in some implementations, include a backplate 122. In such implementations, the target 120 can be positioned relative to the housing 230 such that the housing 230 and the backplate 122 collectively shield the first circuit board 210, the interconnect assembly 300, and the second circuit board 220 from an external environment in which the inductive sensor 200 is located. More specifically, the housing 230 and the backplate 122 of the target 120 can electrically shield the first circuit board 210, the interconnect assembly 300, and the second circuit board 220 from one or more metal components present in the external environment.

In this manner, electromagnetic coupling between the one or more metal components and the inductive sensor 100, specifically the first circuit board 210, the interconnect assembly 300, and the second circuit board 220 thereof can be prevented.

Furthermore, in some implementations, the target 120 can be positioned relative to the housing 230 such that an air gap 600 is defined between the housing 230 and the backplate 122 along the radial direction R. In addition, the air gap 600 can be further defined between the housing 230 and the backplate 122 along the axial direction A. However, it should be understood that a length of the backplate 122 as measured along the radial direction R can be greater than a length of the first circuit board 210 as measured along the radial direction R and a length of the second circuit board 220 as measured along the radial direction R. In this manner, the housing 230 and the backplate 122 of target 120 can still collectively shield the first circuit board 210, the interconnect assembly 300 (FIG. 7) and the second circuit board 220 from the external environment in which the inductive sensor 200 is located. More specifically, the housing 230 and the backplate 122 of the target 120 can still electrically shield the first circuit board 210, the interconnect assembly 300, and the second circuit board 220 from the one or more metal components present within the external environment despite the air gap 600 defined between the housing 230 and the backplate 122 of the target 120 along the radial direction R and the axial direction A. In this manner, electromagnetic coupling between the one or more metal components and the inductive sensor 100, specifically the first circuit board 210, the interconnect assembly 300, and the second circuit board 220 thereof can be prevented.

In some implementations, the feet 324 of the spacer 320 can contact the bottom wall 236 of the housing 230 that extends between an inner wall 237 of the housing 230 and an outer wall 238 of the housing 230 along the radial direction R. In this manner, the second circuit board 220 can, as shown, be spaced apart from the bottom wall 236 of the housing 230 along the axial direction A. It should be appreciated that, in alternative implementations, the second circuit board 220 can be positioned on the bottom wall 236 of the housing 230. In particular, the second circuit board 220 can contact (e.g., touch) the bottom wall 236 of the housing 230.

Figure 20:
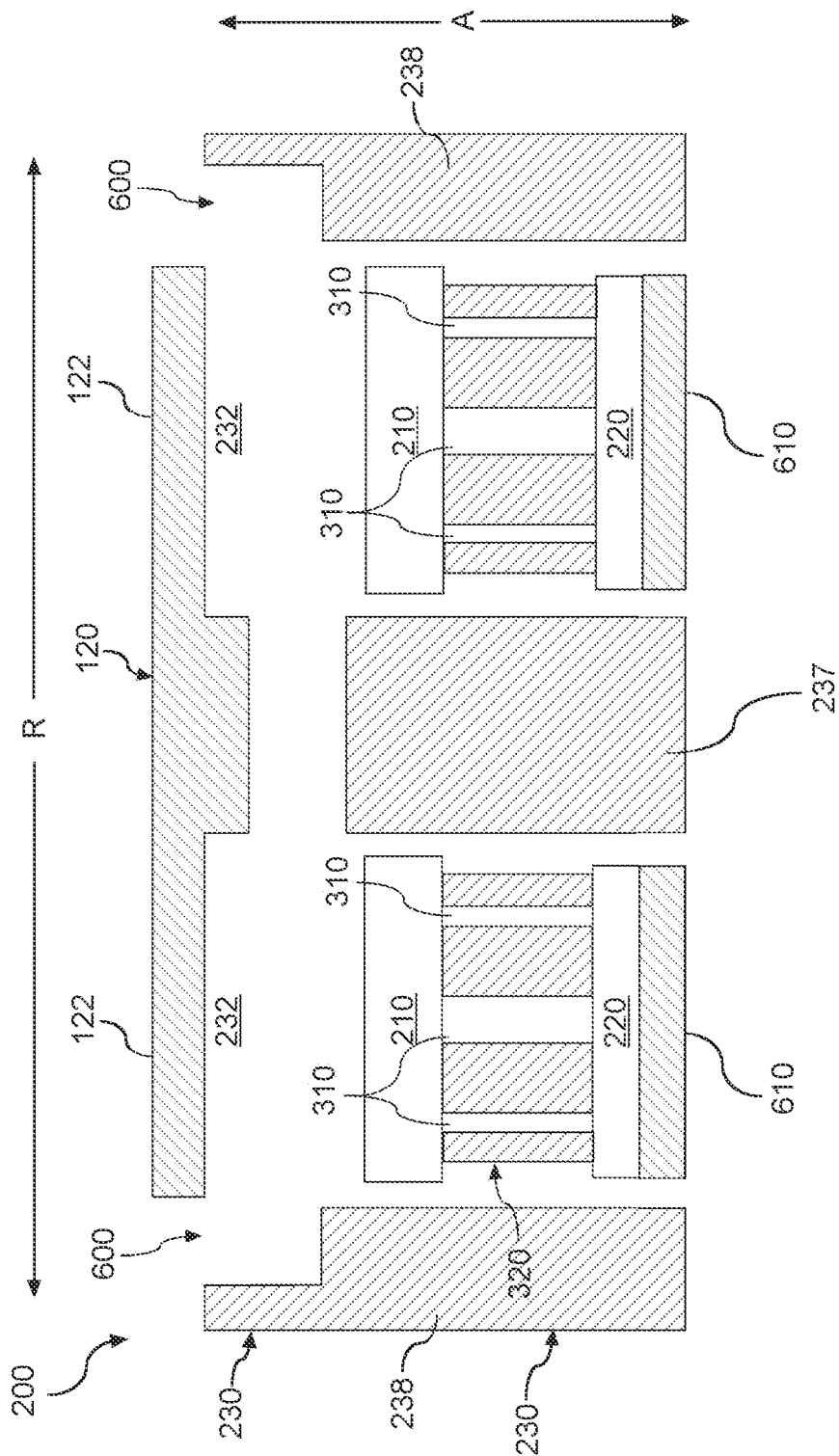
FIG. 20 depicts another cross-sectional view of an inductive sensor according to example embodiments of the present disclosure.

Referring now to FIG. 20, the inductive sensor 200 can, in some implementations, include an unbroken conductive plane 610. In some implementations, unbroken conductive plane 610 can include an electrical ground plane. In alternative implementations, the unbroken conductive plane 610 can include a power plane. In still other implementations, the unbroken conductive plane 610 can be electrically floating (i.e., not electrically grounded).

As shown, the unbroken conductive plane 610 can be positioned within the cavity 232 defined by the housing 230. Furthermore, the unbroken conductive plane 610 can extend between the inner wall 237 of the housing 230 and the outer wall 238 of the housing 230 along a radial direction R. In some implementations, the unbroken conductive plane 610 can be spaced apart from the inner wall 237 and outer wall 238 along the radial direction R. In this manner, an air gap can be defined between the unbroken conductive plane 610 and the inner wall 237 of the housing 230. Likewise, an air gap can be defined between the unbroken conductive plane 610 and the outer wall 238 of the housing 230.

The unbroken conductive plane 610 can replace the bottom wall 236 (FIG. 19) of the housing 230. In this manner, an amount of material (e.g., metal) needed for the housing 230 can be reduced since the bottom wall 236 of the housing 230 is no longer needed. As shown, a length of the unbroken conductive plane 610 as measured along the radial direction R can be equal to or greater than a length of the second circuit board 220 as measured along the radial direction R. In this manner, the housing 230, the unbroken conductive plane 610, and the backplate 122 of the target 120 can collectively shield the first circuit board 210, the second circuit board 220, and the interconnect assembly 300 (FIG. 6) from the external environment in which the inductive sensor 200 is located. More specifically, the housing 230, the unbroken conductive plane 610, and the backplate 122 of the target 120 can electrically shield the first circuit board 210, the interconnect assembly 300, and the second circuit board 220 from one or more metal components within the external environment. In this manner, electromagnetic coupling between the one or more metal components and the inductive sensor 200, specifically the first circuit board 210, the interconnect assembly 300, and the second circuit board 220 thereof can be prevented.

In some implementations, the unbroken conductive plane 610 can be separate from the second circuit board 220. In such implementations, the second circuit board 220 can, as shown, be positioned on the unbroken conductive plane 610. More specifically, the second circuit board 220 can contact (e.g., touch) the unbroken conductive plane 610. Alternatively, the second circuit board 220 can be spaced apart from the unbroken conductive plane 610 along the axial direction A. For instance, in some implementations, the feet 324 of the spacer 320 (FIG. 7) can contact the unbroken conductive plane 610. In this manner, the second circuit board 220 can be spaced apart from the unbroken conductive plane 610 along the axial direction A.

In some implementations, the unbroken conductive plane 610 can be integral with the second circuit board 220. For instance, in some implementations, the unbroken conductive plane 610 can be included as a layer of the second circuit board 220. In this manner, a number of discrete components of the inductive sensor 200 can be reduced, because the unbroken conductive plane 610 is included as one of the layers of the second circuit board 220.

Figure 21:
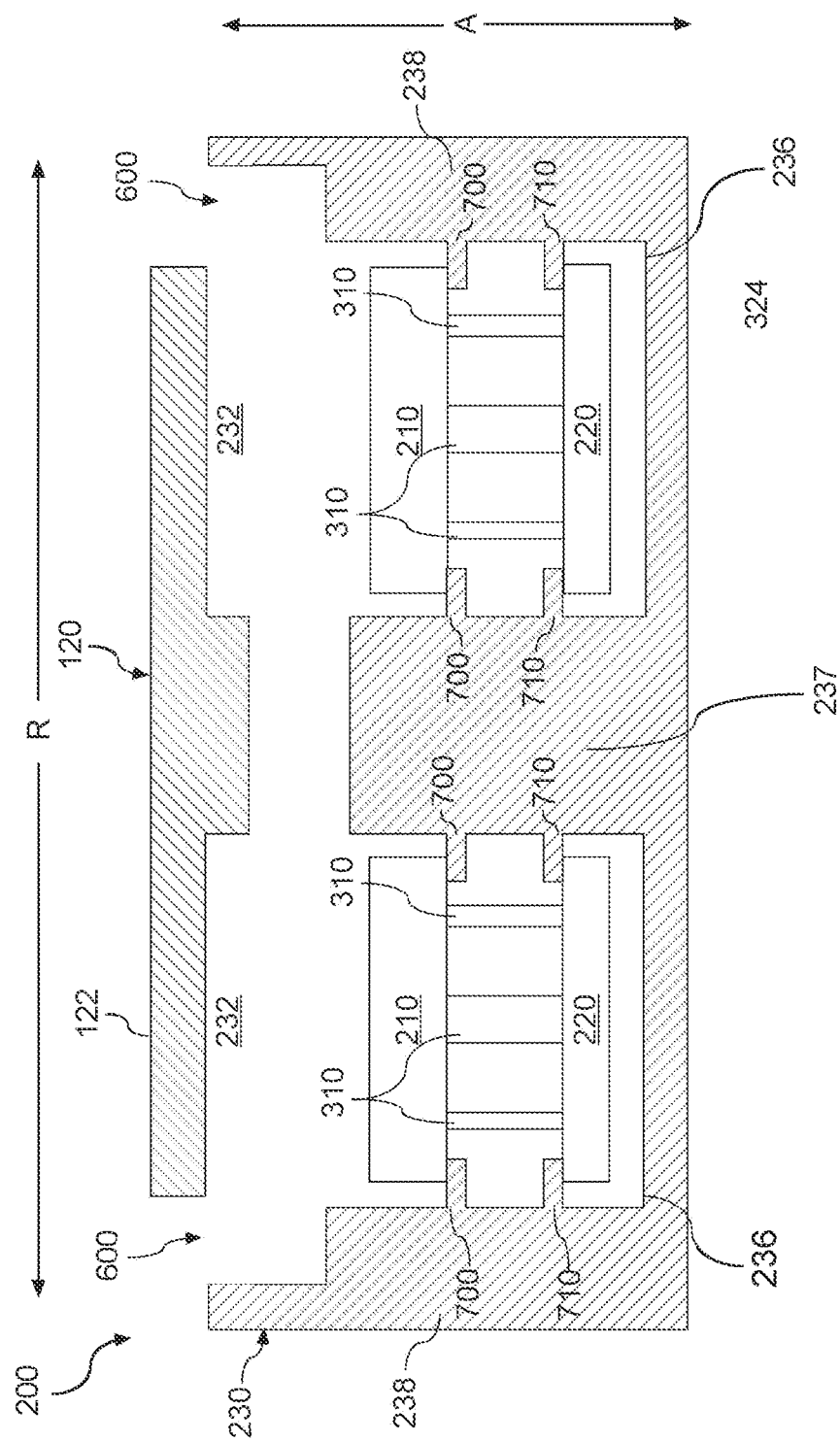
FIG. 21 depicts yet another cross-sectional view of an inductive sensor according to example embodiments of the present disclosure.

Referring now to FIG. 21, the first circuit board 210 and the second circuit board 220 can, in some implementations, be positioned on shelves positioned within the cavity 232 of the housing 230. For instance, the first circuit board 210 can be positioned on a first shelf 700 positioned within the cavity 232. Conversely, the second circuit board 220 can be positioned on a second shelf 710 positioned within the cavity 232. As shown, the second shelf 710 can be spaced apart from the first shelf 700 along the axial direction A such that the first circuit board 210 and the second circuit board 220 are spaced apart from one another along the axial direction A. In this manner, the spacer 320 (FIG. 7) of the interconnect assembly 300 is no longer needed to provide spacing between the first circuit board 210 and the second circuit board 220 along the axial direction A. Furthermore, although the first shelf 700 and the second shelf 710 are depicted as being integral with the housing 230, it should be appreciated that, in some implementations, the first shelf 700 and the second shelf 710 can be separate (i.e., not integral) from the housing 230.

Figure 22:
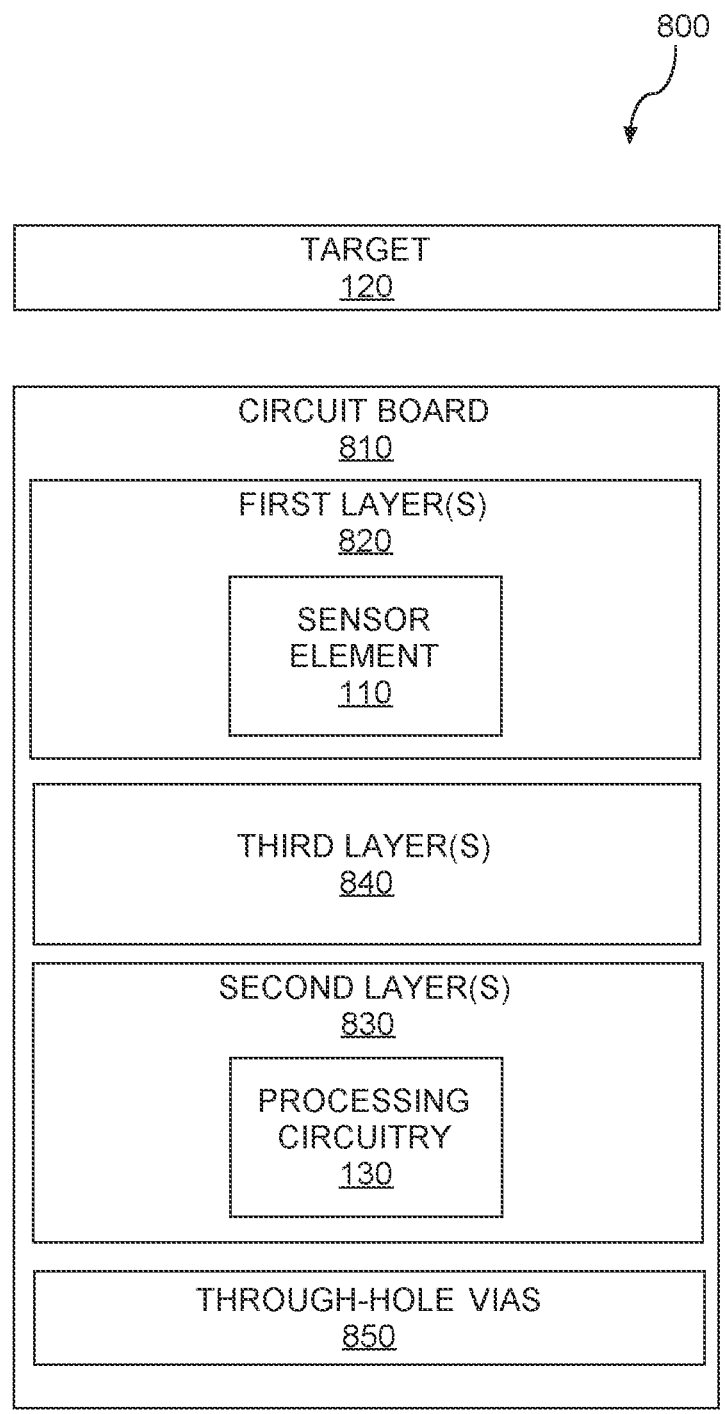
FIG. 22 components of an inductive sensor according to example embodiments of the present disclosure.
Figure 23:
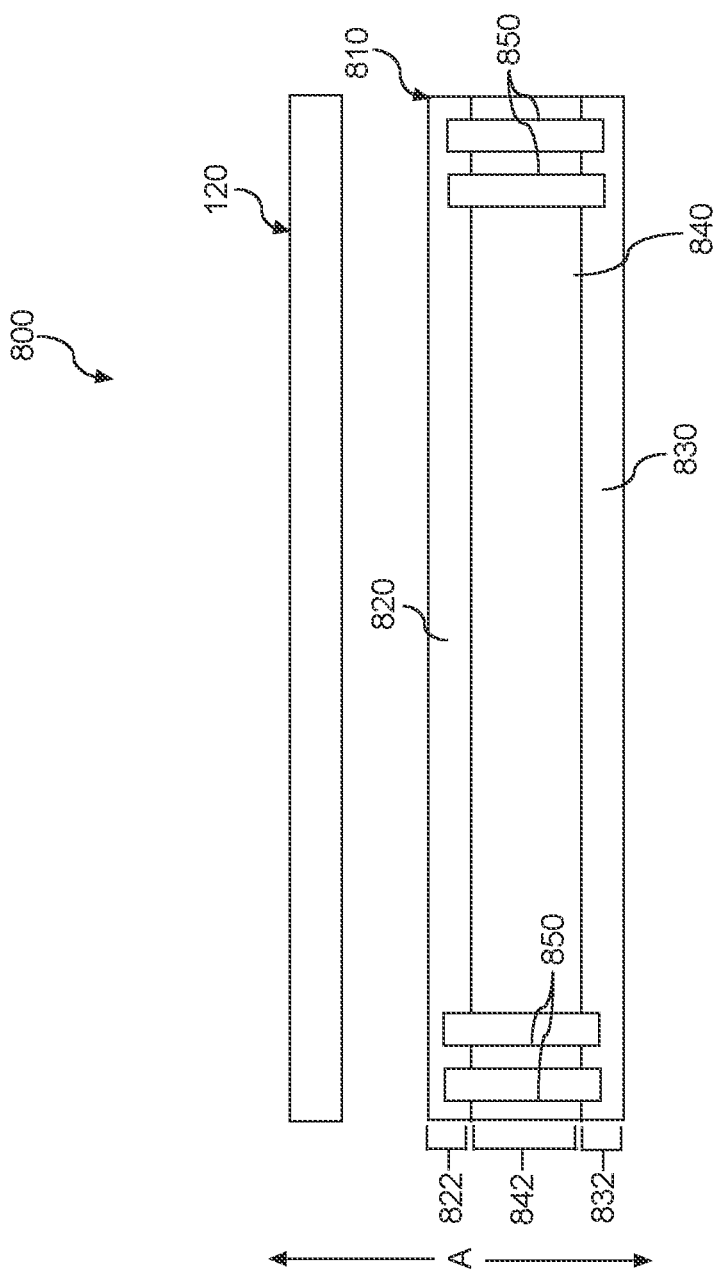
FIG. 23 depicts still another cross-sectional view of an inductive sensor according to example embodiments of the present disclosure.

Referring now to FIGS. 22 and 23, an inductive sensor 800 is provided according to example embodiments of the present disclosure. As shown, the inductive sensor 800 includes the target 120 discussed above with reference to FIG. 1. Furthermore, the inductive sensor 800 includes a circuit board 810. The circuit board 810 can include a first set of layers 820, a second set of layers 830, and an intermediate third set of layers 840 positioned between the first set of layers 820 and the second set of layers 830. The sensor element 110 can be included within the first set of layers 820. Furthermore, one or more electronic components (e.g., processors, sensors, communication interfaces) of the processing circuitry 130 associated with the sensor element 110 can be included within the second set of layers 830. In some implementations, a thickness 842 of the intermediate third set of layers 840 can be greater than a thickness 822 of the first set of layers and a thickness 832 of the second set of layers 830. In this manner, the first set of layers 820 can be spaced apart from the second set of layers 830 via the intermediate third set of layers 840. In some implementations, the intermediate third set of layers 840 can be formed from FR4 material. Alternatively, or additionally, at least one of the first set of layers 820 or the second set of layers 830 can be formed from FR4 material.

As shown, the circuit board 810 can include a plurality of conductive through-hole vias 850 extending from the first set of layers 820 through the intermediate third set of layers 840 to the second set of layers 830. In this manner, the plurality of conductive through-hole vias 850 can electrically couple the sensor element 110 included within the first set of layers 820 of the circuit board 810 to the processing circuitry 130 included within the second set of layer 830 of the circuit board 810. Furthermore, it should be appreciated that the plurality of conductive through-hole vias 850 can be disposed at a same location for each of the plurality of different coil configurations of the sensor element 110 and each of the plurality of different configurations of the processing circuitry 130.

It should be appreciated that the first set of layer 820, the second set of layers 830, and the intermediate third set of layers 840 can each include one or more layers. For instance, the first set of layers 820 can include one or more layers of the circuit board 810, the second set of layers 830 can include one or more layers of the circuit board 810, and the intermediate third set of layers 840 can include one or layers of the circuit board 810.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. An inductive sensor defining an axial direction, a circumferential direction, and a radial direction, the inductive sensor comprising:
   a first circuit board comprising:
      a sensor element having a first coil configuration, the sensor element comprising a transmit coil and a plurality of receive coils, the transmit coil configured to induce an electrical current in the plurality of receive coils via a target; and
      a plurality of interconnect points positioned on the first circuit board for the first coil configuration; and
   a second circuit board spaced apart from the first circuit board along the axial direction, the second circuit board comprising:
      processing circuitry associated with the sensor element, the processing circuitry having a first configuration; and
      a plurality of interconnect points positioned on the second circuit board for the first configuration of the processing circuitry, each of the plurality of interconnect points on the second circuit board aligned with a corresponding interconnect point of the plurality of interconnect points on the first circuit board along the circumferential direction and the radial direction;
   a housing defining a cavity in which the first circuit board and the second circuit board are disposed,
   an interconnect assembly disposed within the cavity of the housing such that the interconnect assembly is positioned between the first circuit board and the second circuit board along the axial direction, the interconnect assembly comprising a plurality of conductive pins, each of the plurality of conductive pins coupled between a corresponding interconnect point on the first circuit board and a corresponding interconnect point on the second circuit board, wherein the interconnect assembly further comprises a spacer defining a plurality of apertures, each of the plurality of apertures aligned with a corresponding interconnect point of the interconnect points on the first circuit board and the second circuit along the radial direction and the circumferential direction, each of the plurality of apertures configured to accommodate a corresponding conductive pin of the plurality of conductive pins such that the corresponding conductive pin extends therethrough, the spacer further comprises:
      a first post extending in a first direction along the axial direction, the first post extending through an aperture defined by the first circuit board; and
      a second post extending in a second direction along the axial direction, the second post extending through an aperture defined by the second circuit board.

2. The inductive sensor of claim 1, wherein the plurality of interconnect points of the first circuit board and the second circuit board comprise:
   a first group of interconnect points positioned at a first location;
   a second group of interconnect points positioned at a second location that is spaced apart from the first location along the circumferential direction by about 90 degrees;
   a third group of interconnect points positioned at a third location that is spaced apart from the first location along the circumferential direction by about 180 degrees; and
   a fourth group of interconnect points positioned at a fourth location that is spaced apart from the first location along the circumferential direction by about 270 degrees.

3. The inductive sensor of claim 2, wherein at least one of the first group of interconnect points, the second group of interconnect points, the third group of interconnect points, and the fourth group of interconnect points include four interconnect points arranged in a diamond configuration.

4. The inductive sensor of claim 1, wherein:
   a first end of each of the plurality of conductive pins is connected to the corresponding interconnect point on the first circuit board; and
   a second end of each of the plurality of conductive pins is connected to the corresponding interconnect point on the second circuit board.

5. The inductive sensor of claim 1, wherein the plurality of apertures defined by the spacer comprise:
- a first group of apertures positioned at a first location;
- a second group of apertures positioned at a second location that is spaced apart from the first location along the circumferential direction by about 90 degrees;
- a third group of apertures positioned at a third location that is spaced apart from the first location along the circumferential direction by about 180 degrees; and
- a fourth group of apertures positioned at a fourth location that is spaced apart from the first location along the circumferential direction by about 270 degrees.

6. The inductive sensor of claim 1, wherein the processing circuitry comprises at least one of a motion sensor and a temperature sensor.

7. The inductive sensor of claim 1, wherein the processing circuitry comprises one or more processors configured to process an output signal obtained from one or more of the plurality of receive coils.

* * * * *